(12) United States Patent
Son et al.

(10) Patent No.: US 7,602,028 B2
(45) Date of Patent: Oct. 13, 2009

(54) NAND FLASH MEMORY DEVICES HAVING 3-DIMENSIONALLY ARRANGED MEMORY CELLS AND METHODS OF FABRICATING THE SAME

(75) Inventors: Yang-Soo Son, Yongin-si (KR);
Young-Seop Rah, Yongin-si (KR);
Won-Seok Cho, Suwon-si (KR);
Soon-Moon Jung, Seongnam-si (KR);
Jae-Hoon Jang, Seongnam-si (KR);
Young-Chul Jang, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 260 days.

(21) Appl. No.: 11/653,890

(22) Filed: Jan. 17, 2007

(65) Prior Publication Data

US 2008/0087932 A1 Apr. 17, 2008

(30) Foreign Application Priority Data

Oct. 11, 2006 (KR) ...................... 10-2006-0099015

(51) Int. Cl.
*H01L 29/76* (2006.01)
(52) U.S. Cl. ...................... 257/390; 257/401; 257/724; 257/777; 257/E27.026
(58) Field of Classification Search ................. 257/390, 257/E27.026, 401, 724, 777, E21.607
See application file for complete search history.

(56) References Cited

U.S. PATENT DOCUMENTS

| 5,321,286 | A | 6/1994 | Koyama et al. | |
|---|---|---|---|---|
| 6,300,683 | B1 * | 10/2001 | Nagasaka et al. | 257/774 |
| 2004/0125629 | A1 | 7/2004 | Scheuerlein et al. | |
| 2005/0263830 | A1 * | 12/2005 | Wang et al. | 257/382 |
| 2006/0049449 | A1 * | 3/2006 | Iino et al. | 257/315 |

FOREIGN PATENT DOCUMENTS

| KR | 10-2004-0058990 A | 7/2004 |
|---|---|---|
| KR | 10-2005-0010260 A | 1/2005 |
| KR | 10-2005-0079233 A | 8/2005 |
| KR | 1020060057821 A | 5/2006 |

* cited by examiner

*Primary Examiner*—Tu-Tu V Ho
(74) *Attorney, Agent, or Firm*—Volentine & Whitt, PLLC

(57) ABSTRACT

A NAND flash memory device includes a lower semiconductor layer and an upper semiconductor layer located over the lower semiconductor layer, a first drain region and a first source region located in the lower semiconductor layer, and a second drain region and a second source region located in the upper semiconductor layer. A first gate structure is located on the lower semiconductor layer, and a second gate structure is located on the upper semiconductor layer. A bit line is located over the upper semiconductor layer, and at least one bit line plug is connected between the bit line and the first drain region, where the at least one bit line plug extends through a drain throughhole located in the upper semiconductor layer.

18 Claims, 21 Drawing Sheets

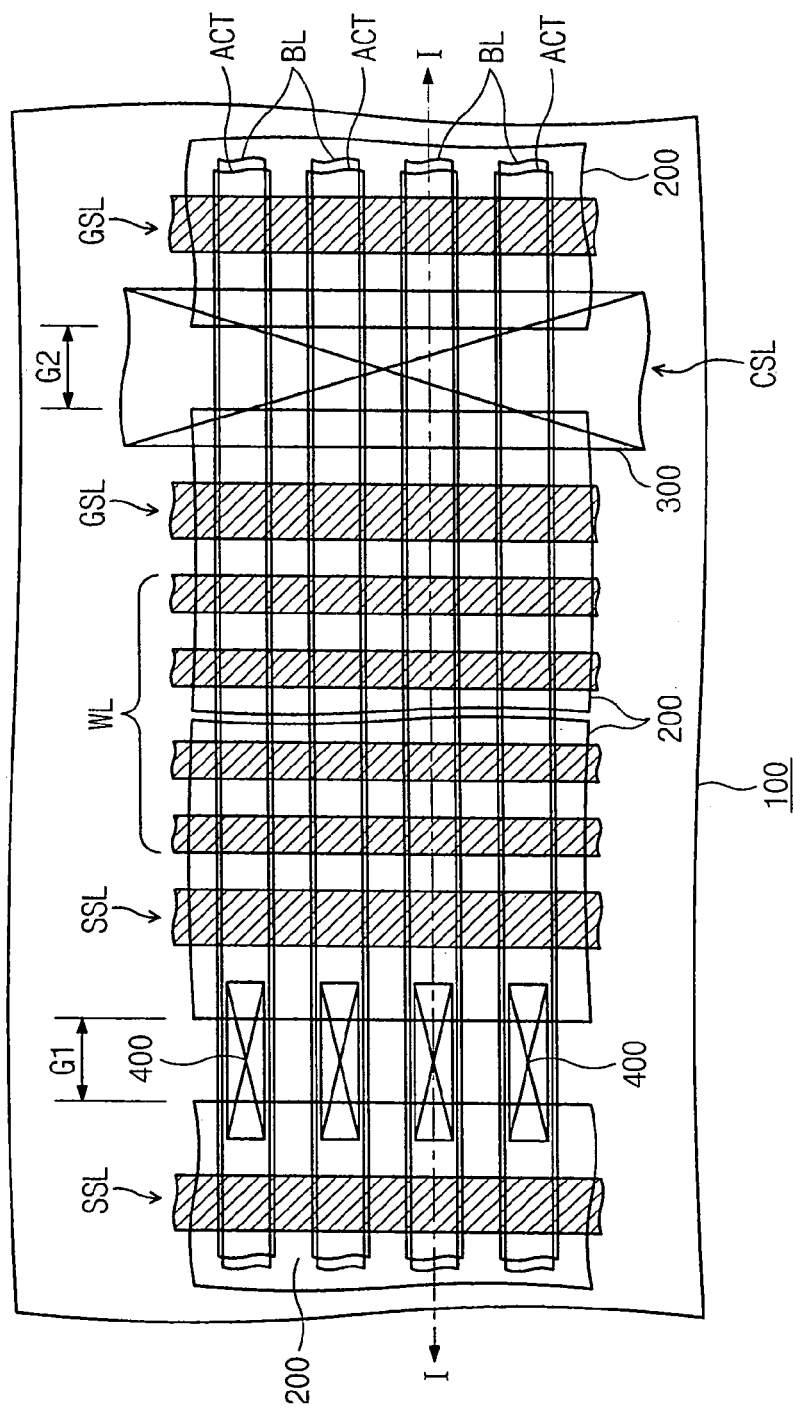

NAND FLASH MEMORY DEVICES HAVING 3-DIMENSIONALLY ARRANGED MEMORY CELLS AND METHODS OF FABRICATING THE SAME

BACKGROUND OF THE INVENTION

The present disclosure relates generally to a method of fabricating a semiconductor device and, more particularly, to a method of fabricating a NAND flash memory device having 3-dimensionally arranged memory cells.

A claim of priority under 35 U.S.C. § 119 is made to Korean Patent Application No. 2006-99015, filed on Oct. 11, 2006, the entire contents of which are hereby incorporated by reference.

Most modern electronic appliances include semiconductor devices. These semiconductor devices include a number of elements. Specifically, these semiconductor devices include electronic elements such as, for example, transistors, resistors, capacitors, or the like. Beneficially, these electronic elements are integrated on a semiconductor substrate after they are designed to perform specific functions for the electronic appliances. For example, electronic appliances such as computers and digital cameras include memory chips for storing information and processing chips for processing information. These memory chips and processing chips include electronic elements that are integrated on the semiconductor substrate after being configured to perform information storing and processing functions, respectively.

In order to keep up with customer demand for low price, more efficient, and smaller size devices, there is a growing need for highly integrated semiconductor devices. However, there are certain shortcomings in the semiconductor manufacturing process that affect the availability of highly integrated semiconductor devices. For example, there is a need for advancement in processing technologies such as, for example, lithography technology. However, advanced processing technologies require the expenditure of large amount of capital and may be stuck in research and development cycles for a long time before they are commercially viable for the manufacture of highly integrated semiconductor devices.

In order to work around the restrictions placed by current manufacturing technology, there have been proposals to use 3-dimensionally arranged transistors in semiconductor devices. For example, Korean Patent Application No. 2006-73858 discloses a NAND flash memory device having 3-dimensionally arranged transistors. Such a method of fabricating the semiconductor device includes forming single crystal semiconductor layer(s) on a wafer used as a semiconductor substrate through an epitaxial technology, and thereafter forming transistors on the semiconductor layer(s).

Furthermore, when source and drain electrodes of memory cell transistors are three dimensionally arranged, plugs connecting these source and drain electrodes are needed for electrically accessing the memory cell transistors. However, it may not be easy to form these plugs in three dimensional semiconductor devices. For example, in the NAND flash memory device disclosed in Korean Patent Application No. 2006-73858, the memory transistors formed on different layers are electrically connected to each other through stacked plugs and local interconnections that are formed through different processes.

There may be many problems associated with the use of different processes to fabricate the 3-dimensional semiconductor device. These problems may include, for example the increasing complexity of the over all fabrication process and the increase in fabrication cost. The complexity of a semiconductor device may be reduced by decreasing the chip area available. However, the loss of chip area availability may reduce the integration density of the semiconductor device. This feature is contrary to one of the important objectives of a 3-dimensional semiconductor device.

SUMMARY OF THE INVENTION

According to an aspect of the present disclosure, a NAND flash memory device is provided which includes a lower semiconductor layer and an upper semiconductor layer located over the lower semiconductor layer, a first drain region and a first source region located in the lower semiconductor layer, and a second drain region and a second source region located in the upper semiconductor layer. A first gate structure is located on the lower semiconductor layer, and a second gate structure is located on the upper semiconductor layer. A bit line is located over the upper semiconductor layer, and at least one bit line plug is connected between the bit line and the first drain region, where the at least one bit line plug extends through a drain throughhole located in the upper semiconductor layer.

According to another aspect of the present disclosure, a method of fabricating a NAND flash memory device is provided which includes forming a lower source region and a lower drain region in a lower semiconductor layer, forming an upper semiconductor layer over the lower semiconductor layer, the upper semiconductor layer including a drain throughhole, an upper source region and an upper drain region, and forming at least one bit line plug which extends through the drain throughhole and is connected to the upper and lower drain regions.

BRIEF DESCRIPTION OF THE FIGURES

The accompanying figures are included to provide a further understanding of the present disclosure, and are incorporated in and constitute a part of this specification. The drawings illustrate exemplary embodiments of the present disclosure and, together with the description, serve to explain principles of the present invention. In the figures:

FIGS. 1A through 1D are plan views illustrating cell arrays of NAND flash memory devices according to exemplary disclosed embodiments;

DETAILED DESCRIPTION OF PREFERRED EMBODIMENTS

Exemplary embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art.

It will also be understood that when a layer (or film) is referred to as being 'on' another layer or substrate, it can be directly on the other layer or substrate, or intervening layers may also be present. Further, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present. Similarly, it will also be understood that when an element is referred to as being 'connected' to another element, the two elements can be directly connected to each other, or operatively (e.g., electrically) connected to each other. In the figures, the dimensions of layers and regions are exaggerated for clarity of illustration. In the specification, although terms of "first", "second", "third" or the like is used for describing various regions, layers, etc. the regions, the layer, etc should not be limited to these terms. Theses terms are only used for discriminating the regions and layers from one another. Thus, a first layer mentioned in one embodiment may be referred to as a second layer in another embodiment. Each embodiment described herein may include a complementary embodiment thereof.

FIGS. 1A to 1D are plan views illustrating cell arrays of NAND flash memory devices according to an exemplary disclosed embodiment. Furthermore, FIGS. 2A through 2C are sectional views illustrating cell arrays of the NAND flash memory devices according to an exemplary disclosed embodiment. More specifically, FIGS. 2A through 2C are sectional views taken along dotted lines I-I' of FIGS. 1A through 1D, respectively.

Figure 1A:
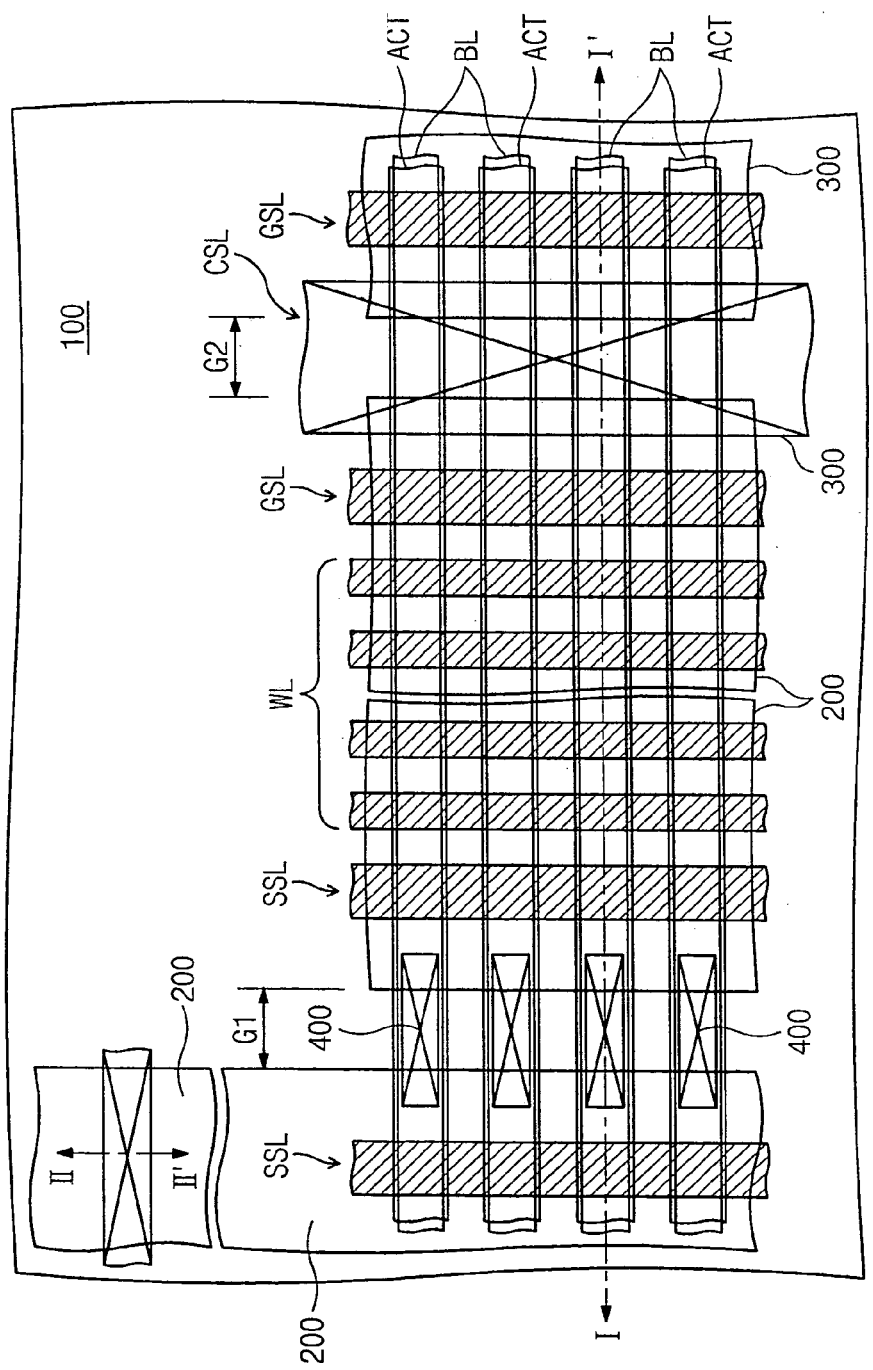
Figure 2A:
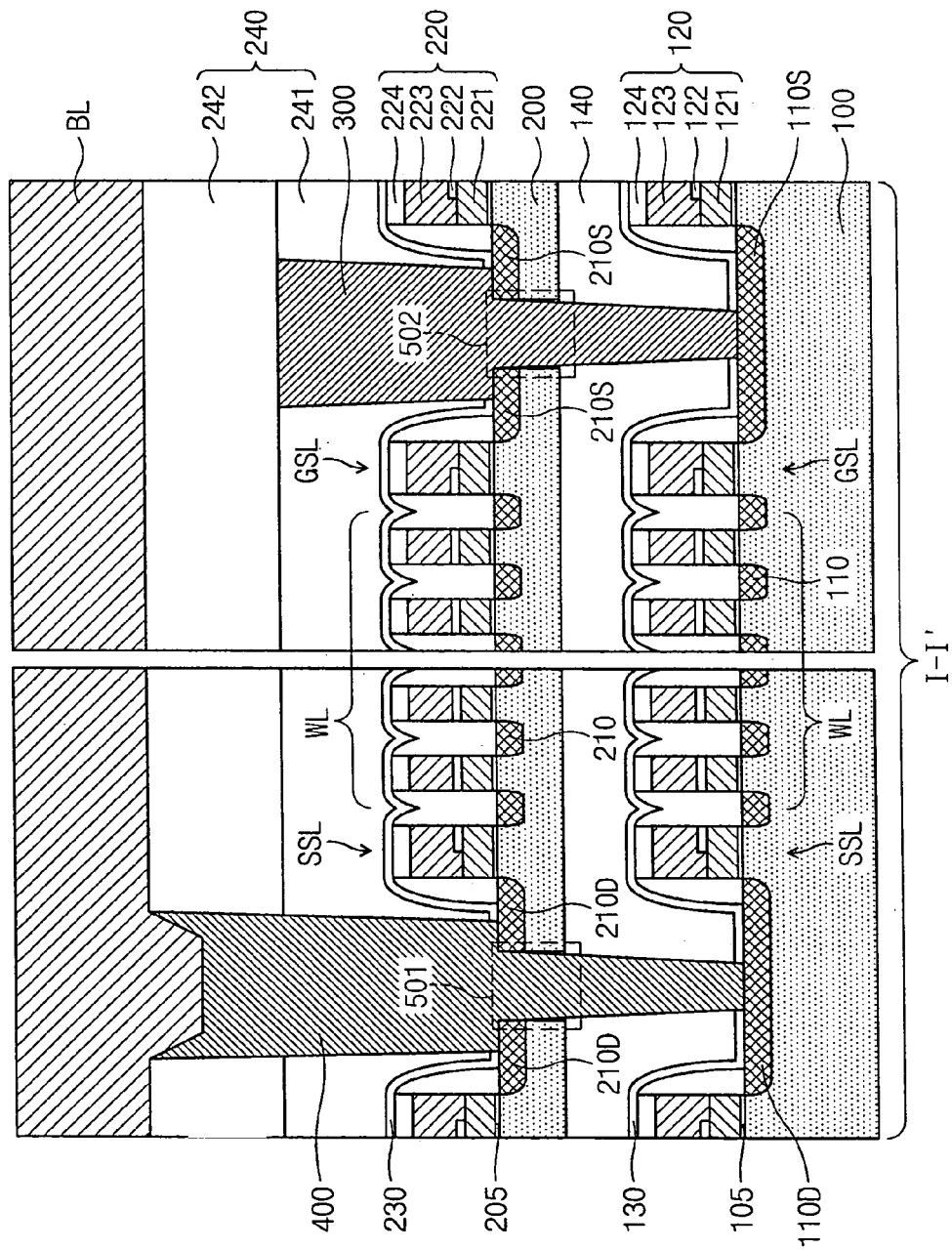
FIGS. 2A through 2C are sectional views illustrating cell arrays of the NAND flash memory devices according to exemplary disclosed embodiments.
Figure 2B:
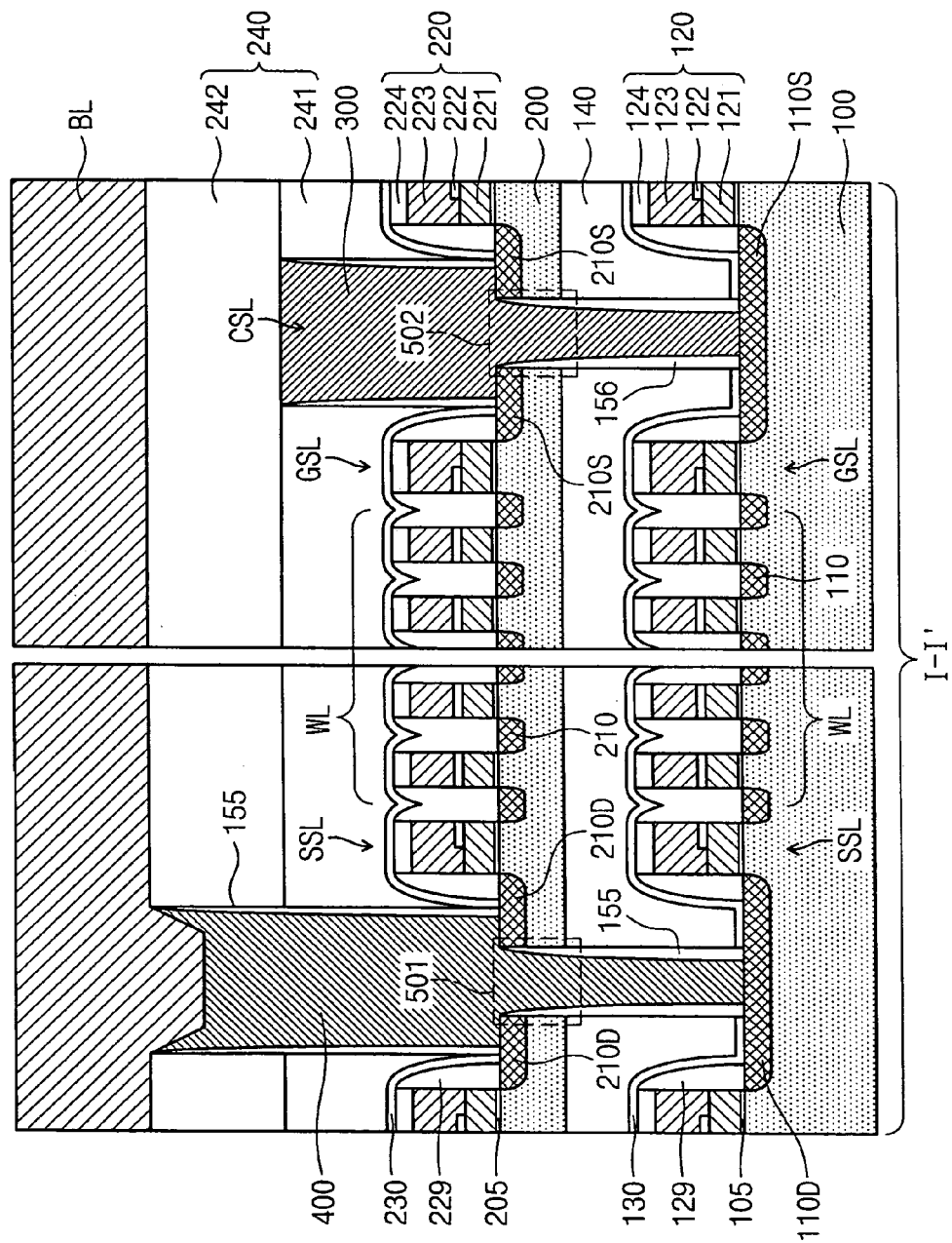
Figure 2C:
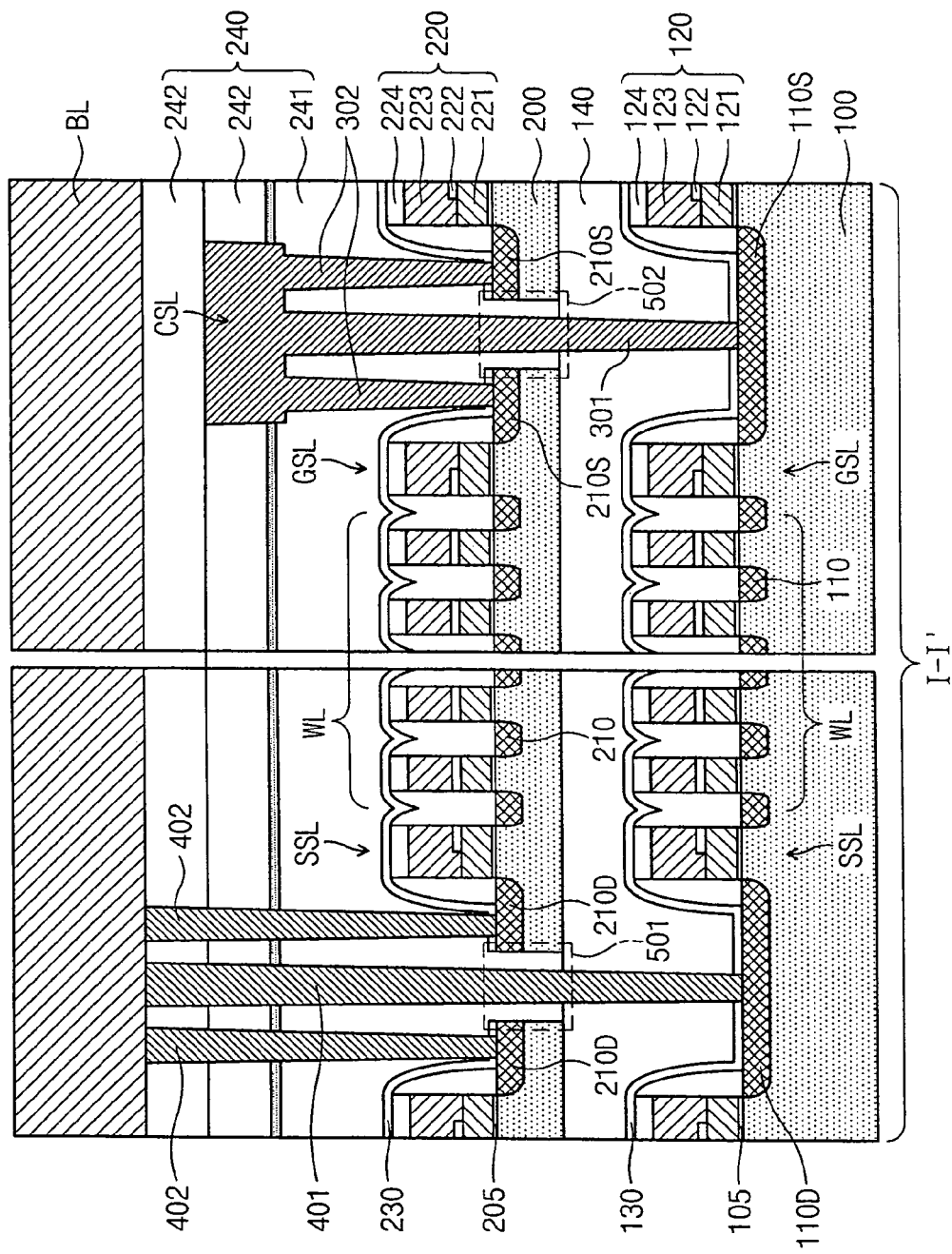

Referring to FIGS. 1A and 2A, a NAND flash memory device in an exemplary disclosed embodiment includes a lower semiconductor layer 100, and at least one upper semiconductor layer 200 disposed on the lower semiconductor layer 100. For the sake of conciseness, only one upper semiconductor layer in an exemplary disclosed embodiment will be shown. However, one skilled in the art will appreciate that a plurality of upper layers may be disposed on the lower semiconductor layer 100 without departing from the scope of the present disclosure. Furthermore, the lower semiconductor layer 100 may be a wafer formed of single crystal semiconductor material. In addition, beneficially, the upper semiconductor layer 200 is formed of single crystal semiconductor material, which will be illustrated in detail later.

A lower gate structure 120 and an upper gate structure 220 are disposed over the lower semiconductor layer 100 and the upper semiconductor layer 200, respectively. Furthermore, each of the lower and upper gate structures 120 and 220 includes a string selection line SSL, a ground selection line GSL and a plurality of word lines WL disposed between the string selection line SSL and the ground selection line GSL.

In addition, a lower gate insulating layer 105 may be disposed between the lower gate structure 120 and the lower semiconductor layer 100, and an upper gate insulating layer 205 may be disposed between the upper gate structure 220 and the upper semiconductor layer 200.

In an exemplary embodiment, the lower gate structure 120 includes a lower floating electrode 121, a lower gate interlayer insulating layer 122, and a lower control electrode 123, all of which are stacked in sequence. Similarly, the upper gate structure 220 includes an upper floating electrode 221, an upper gate interlayer insulating layer 222, and an upper control electrode 223. In addition, lower and upper capping patterns 124 and 224 may be additionally disposed on the lower and upper control electrodes 123 and 223, respectively.

In the word lines WL, the lower and upper floating electrodes 121 and 221 are not electrically connected to the lower and upper control electrodes 123 and 223, respectively. This lack of electrical connection between the lower and upper floating electrodes 121 and 221 and the lower and upper control electrodes 123 and 223, respectively, is because of the lower and upper interlayer insulating layers 122 and 222 interposed therebetween. In contrast, in the string selection line SSL and the ground selection line GSL, the lower and upper floating electrodes 121 and 221 are electrically connected to the lower and upper control electrodes 123 and 223, respectively. To this end, the lower and upper gate interlayer insulating layers 122 and 222 may be formed such that top surfaces of the lower and upper floating electrodes 121 and 221 are partially exposed.

In another exemplary embodiment, the lower and upper gate structures 120 and 220 (hereinafter, referred to as a gate structure) may have a cell gate structure of a charge trap type flash memory. For example, the gate structure 120 and 220 may be a well-known SONOS or TANOS structure. In this case, it may not be necessary to form the lower and upper gate insulating layers 105 and 205.

In the lower semiconductor layer 100, lower impurity regions 110 are formed between the string selection line SSL and the work line WL adjacent thereto, between the word lines WL and between the ground selection line GSL and the word line WL adjacent thereto, respectively. Furthermore, at either side of the lower gate structure 120, a lower source region 110S and a lower drain region 110D are formed. Specifically, the lower source region 110S is formed adjacent to the ground selection line GSL, and the lower drain region 110D is formed adjacent to the string selection line SSL. Moreover, in the upper semiconductor layer 200, upper impurity regions 210, an upper source region 210S and an upper drain region 210D are formed over the lower impurity regions 110, the lower source region 110S and the lower drain region 110D, respectively. In addition, the impurity regions have conductive types different from the lower and upper semiconductor layers 100 and 200.

Gate spacers 129 and 229 may be disposed on sidewalls of each of the string selection line SSL, the ground selection line GSL and the word lines WL. In an exemplary embodiment, as shown in FIG. 2B, the gate spacers 129 and 229 may be formed of silicon oxide or silicon nitride. Furthermore, returning to FIG. 2A, a lower interlayer insulating layer 140 is formed between the lower semiconductor layer 100 and the upper semiconductor layer 200, and an upper interlayer insulating layer 240 is formed on the upper semiconductor layer 200. In an exemplary embodiment, the lower and upper interlayer insulating layers 140 and 240 may include at least one of silicon oxide and silicon nitride.

Furthermore, an upper etch stop layer 230 may be formed over the upper semiconductor layer 200. Specifically, the upper etch stop layer 230 which has a predetermined thickness, may cover the upper semiconductor layer 200 where the upper gate structure 220 is formed. Beneficially, the upper etch stop layer 230 is formed of a material having an etch selectivity with respect to the upper interlayer insulating layer 240.

In addition, a lower etch stop layer 130 may be formed over the lower semiconductor layer 100. In particular, the lower etch stop layer 130 with a predetermined thickness may conformally cover the lower semiconductor layer 100 where the lower gate structure 120 is formed. Beneficially, the lower etch stop layer 130 is formed of a material having an etch selectivity with respect to the upper interlayer insulating layer 240. When the lower and upper etch stop layers 130 and 230 are formed of a material not having an etch selectivity to each other (for example, if they are formed of the same material), it is preferable that the upper etch stop layer 230 is formed thicker than the lower etch stop layer 130 for preventing the etch damage to the upper semiconductor layer 200, which will be described later.

Referring to FIG. 1A, a plurality of bit lines BL crossing over the word lines WL are formed on the upper interlayer insulating layer 240. In addition, a common source line CSL in a parallel with the word lines WL is disposed on the upper semiconductor layer 200. In terms of vertical height, the common source line CSL may be disposed between the upper semiconductor layer 200 and the bit line BL. In addition, referring to FIG. 2A, the bit lines BL are electrically connected to the lower and upper drain electrodes 110D and 210D by means of bit line plugs 400. To this end, the bit line plugs 400 penetrate the lower and upper interlayer insulating layers 140 and 240. Furthermore, the common source lines CSL are electrically connected to the lower and upper source regions 110S and 210D by means of source plugs 300. The source plugs 300 penetrate the lower and upper interlayer insulating layers 140 and 240.

As illustrated in FIG. 2A, the upper interlayer insulating layer 240 may include a first upper interlayer insulating layer 241 encompassing the common source line CSL and a second upper interlayer insulating layer 242 disposed on the common source line CSL. Furthermore, in an exemplary embodiment, a drain throughhole 501 and a source throughhole 502 which penetrate the upper semiconductor layer 200, are formed in the upper semiconductor layer 200 over the lower drain region 110D and the lower source region 110S. Moreover, the bit line plug 400 passes through the drain throughhole 501 so as to be connected to the lower drain region 110D, and the source plug 300 passes through the source throughhole 502 so as to be connected to the lower source region 110S. Additionally, as shown in FIG. 1A, one bit line BL is connected to one lower drain region 110D through one bit line plug 400, whereas the common source line CSL and the source plug are connected to a plurality of the source regions 110S.

In an exemplary embodiment, the bit line plugs 400 may be formed of polysilicon having the same conductive type as the upper and lower drain regions 110D and 210D. In this case, the bit line plugs 400 may be in contact with the upper semiconductor layer 200 at the sidewalls of the drain throughhole 501. At this time, since the upper semiconductor layer 200 and the bit line plugs 400 have different conductive types, they form a PN diode. This PN diode may operate as a rectifier. As a result, when a reverse voltage is applied to the bit line plugs 400, this voltage is not applied to the upper semiconductor layer 200. That is, the bit line plugs 400 and the upper semiconductor layer 200 can be electrically independent.

In an alternative exemplary embodiment, the bit line plugs 400 may be formed of metallic materials such as, for example, tungsten, titanium, tantalum, titanium nitride, tantalum nitride, and tungsten nitride. In this case, to electrically isolate the bit line plugs 400 and the upper semiconductor layer 200 from each other, a drain insulating layer 155 as shown in FIG. 2B, may be formed on the sidewalls of the bit line plugs 400. The drain insulating layer 155 may be formed using a well-known process of forming a spacer.

In an exemplary embodiment, the bit line plug 400 may be divided into two portions, of which one portion is an upper bit line plug disposed over the upper semiconductor layer 200, and the other portion is a lower bit line plug penetrating the upper semiconductor layer 200. Furthermore, the upper bit line plug may be formed such that its width is greater than the width G1 of the drain throughhole 501, as shown in FIGS. 1A, 1B, 1D, and 2A. Therefore, the upper bit line plug is connected to the upper drain regions 210D formed at either side of the drain throughhole 501. In addition, the lower bit line plug is formed such that its width is smaller that or equal to the width G1 of the drain throughhole 501. Moreover, the lower bit line plug successively extends from the bottom surface of the upper bit line plug so that it is connected to the lower drain region 110D.

Figure 1C:
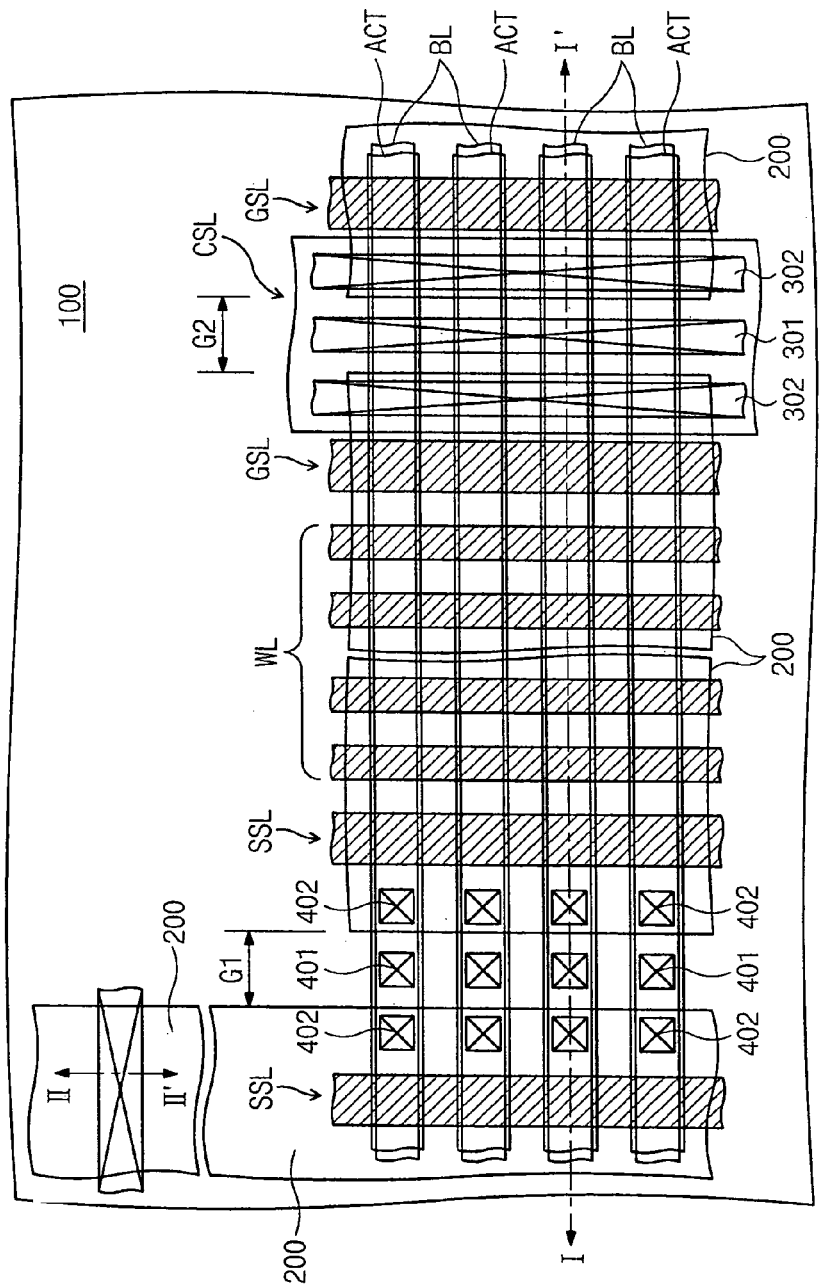

In an alternative exemplary embodiment, referring to FIGS. 1C and 2C, the bit line plugs 400 may be configured with upper bit line plugs 402 and a lower bit line plug 401. Here, the upper bit line plugs 402 are spaced apart from each other. In this case, the upper bit line plugs 402 electrically connect the bit line BL to the upper drain regions 210D, and the lower bit line plug 401 electrically connects the bit line BL to the lower drain region 110D. Furthermore, although the upper bit line plug 402 and the lower bit line plug 401 are physically separated from each other, they are formed at equipotential because they are commonly connected to the bit line BL.

In an exemplary embodiment, the source plugs 300 may be formed of polysilicon having the same conductive type as the upper and lower source regions 110S and 210S. In this case, the source plugs 300 may be in contact with the upper semiconductor layer 200 at the sidewalls of the source throughhole 502. Because the upper semiconductor layer 200 and the source plugs 300 have different conductive types, they form a PN diode which operates as a rectifier. Therefore, when a reverse voltage is applied to the source plug 300, this voltage is not applied to the upper semiconductor layer 200. That is, the source plugs 300 and the upper semiconductor layer 200 can be electrically independent.

In an alternative exemplary embodiment, the source plugs 300 may be formed of one of metallic materials such as, for example, tungsten, titanium, tantalum, titanium nitride, tantalum nitride, and tungsten nitride. In this case, a source insulating layer 156 may be formed on the sidewalls of the source plugs 300 to electrically isolate the source plugs 300 from the upper semiconductor layer 200. The source insulating layer 155 may be formed using a well-known process of forming a spacer.

In an alternative exemplary embodiment, the upper semiconductor layer 200 and the lower semiconductor layer 100 may form an equipotential with the lower and upper source regions 110S and 210S. In this case, the source insulating layer 156 is not formed, and the source plugs 300 may include barrier metal layers to make ohmic contact with the lower and upper semiconductor layers 200 and 300.

In an exemplary embodiment, the source plugs 300 may be divided into two portions, of which one portion is an upper source plug disposed over the upper semiconductor layer 200, and the other portion is a lower source plug penetrating the upper semiconductor layer 200. Moreover, the upper source plug may be formed such that its width is a greater width than the width G2 of the source throughhole 502, as shown in FIGS. 1A, 1B, 1D, and 2A. Therefore, the upper source plug is connected to the upper source regions 210S formed at either side of the source throughhole 502. Additionally, the lower source plug is formed such that its width is smaller than or equal to the width G2 of the source throughhole 502. Furthermore, the lower source plug successively extends from the bottom surface of the upper source plug to be connected to the lower source region 110S.

In another exemplary embodiment, as shown in FIGS. 1C and 2C, the source plug 300 may be configured with a plurality of upper source plugs 302 and a lower source plug 301, wherein the upper source plugs 302 are isolated apart from each other. In this case, the upper source plugs 302 electrically connect the common source line CSL to the upper source regions 210S, and the lower source plug 301 electrically connects the common source line CSL to the lower source region 110S. Furthermore, the common source line CSL and the lower and upper source plugs 301 and 302 may be simultaneously formed using a damascene process. In this case, the upper source plug 302 and the lower source plug 301 are formed at equipotential, as illustrated in FIG. 2C.

FIGS. 3A through 3D are sectional views illustrating a method of fabricating a NAND flash memory device according to an exemplary disclosed embodiment. Hereinafter, a method of forming the bit line plugs 400 and the source line plugs 300 will be illustrated in detail with reference to FIGS. 3A through 3D.

Figure 3A:
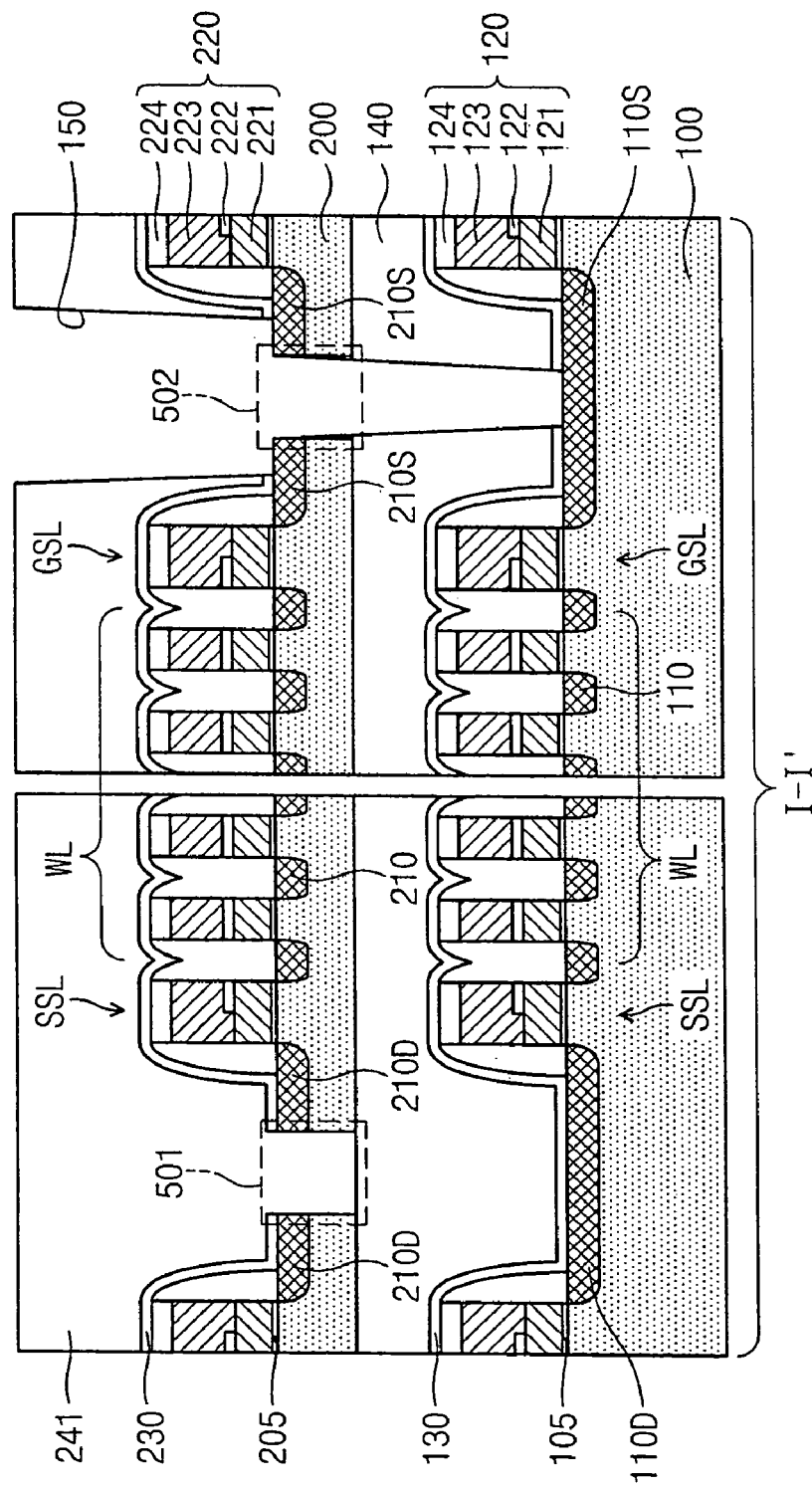
FIGS. 3A through 3D are sectional views illustrating a method of fabricating a NAND flash memory device according to an exemplary disclosed embodiment.

Referring to FIG. 3A, a lower gate structure 120 is formed on a lower semiconductor substrate 100. Thereafter, an ion implantation process is performed using the lower gate structure 120 as an ion mask to form impurity regions 110, lower source regions 110S, and lower drain regions 110D in the lower semiconductor layer 100. Subsequently, a lower etch stop layer 130 and a lower interlayer insulating layer 140 are sequentially formed on the resultant structure where the lower gate structure 120 is formed.

In addition, an upper semiconductor layer 200 is formed over the lower interlayer insulating layer 140. The upper semiconductor layer 200 has a drain throughhole 501 and a source throughhole 502, as described above. In an exemplary embodiment, the upper semiconductor layer 200 may be formed using various methods. Hereinafter, before illustrating the method of forming the bit line plugs 400 and the source line plugs 300, a method of forming the upper semiconductor layer 200 will be illustrated with reference to FIGS. 5A, 5B, 6A through 6C, 7A and 7B.

Figure 5A:
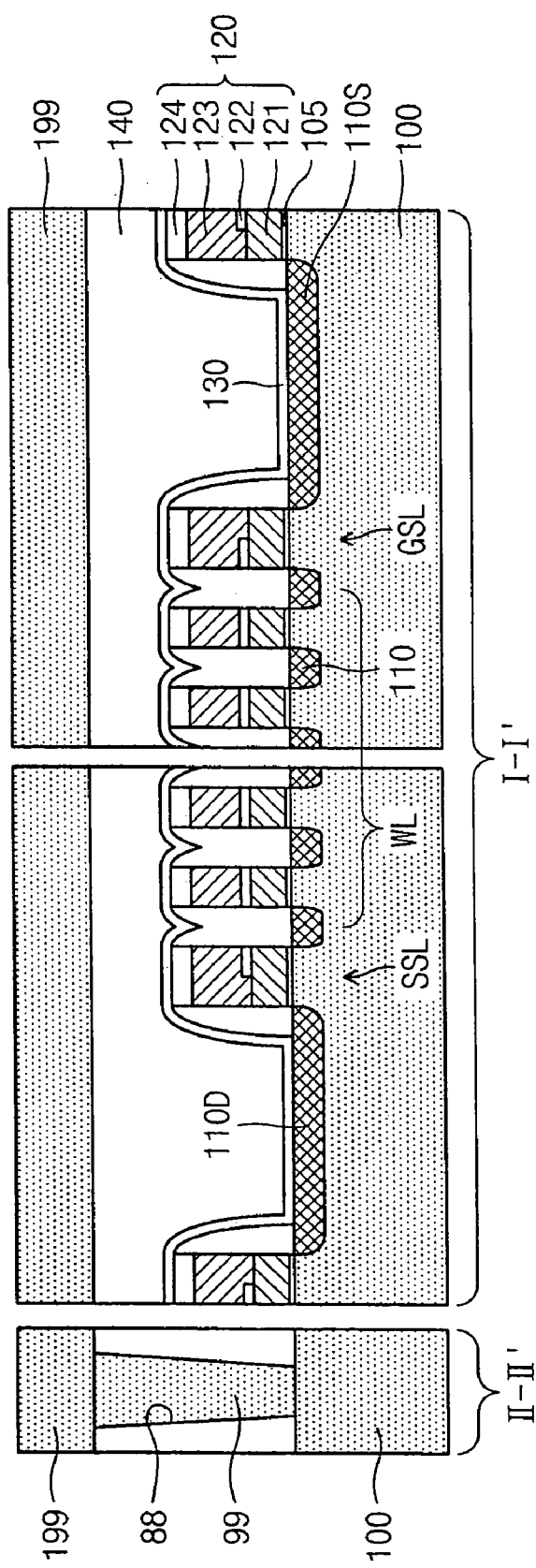
FIGS. 5A and 5B are sectional views illustrating a method of fabricating a NAND flash memory device according to yet other alternative exemplary disclosed embodiment.
Figure 5B:
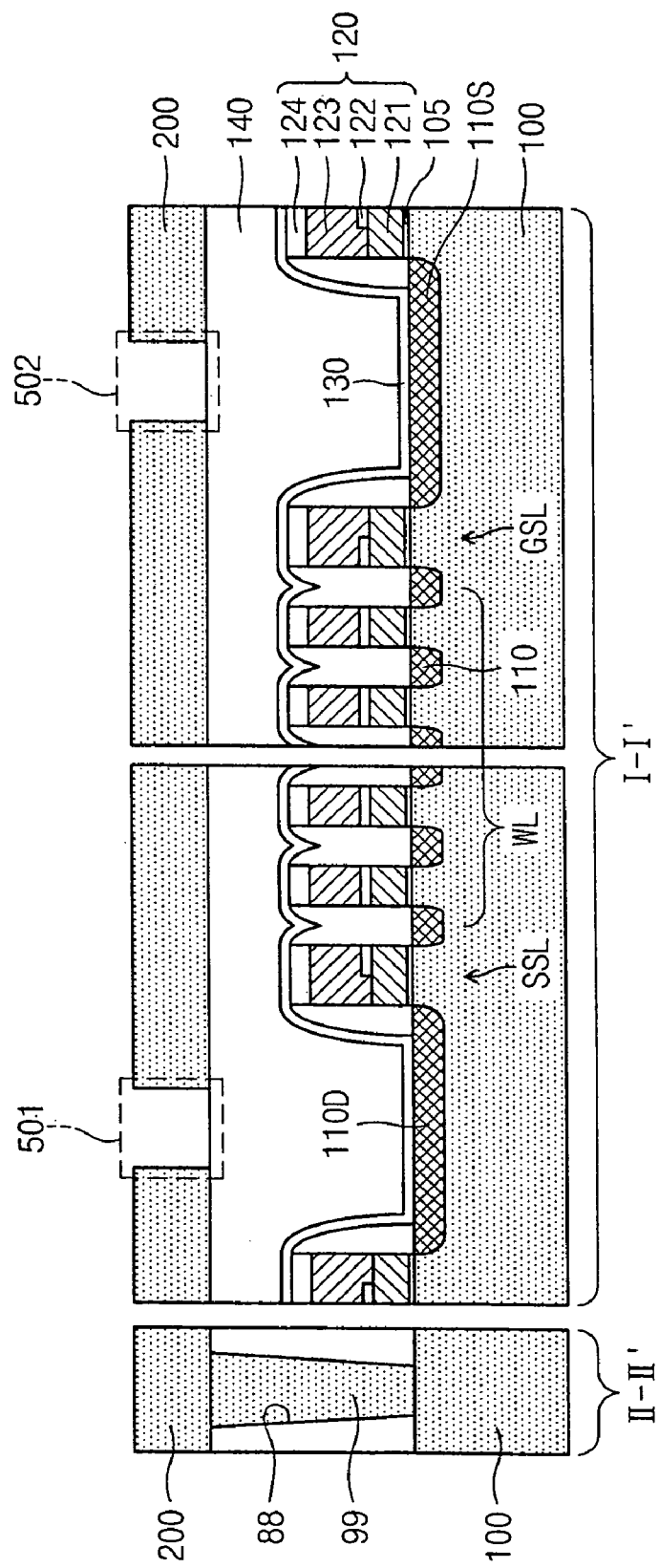
Figure 6A:
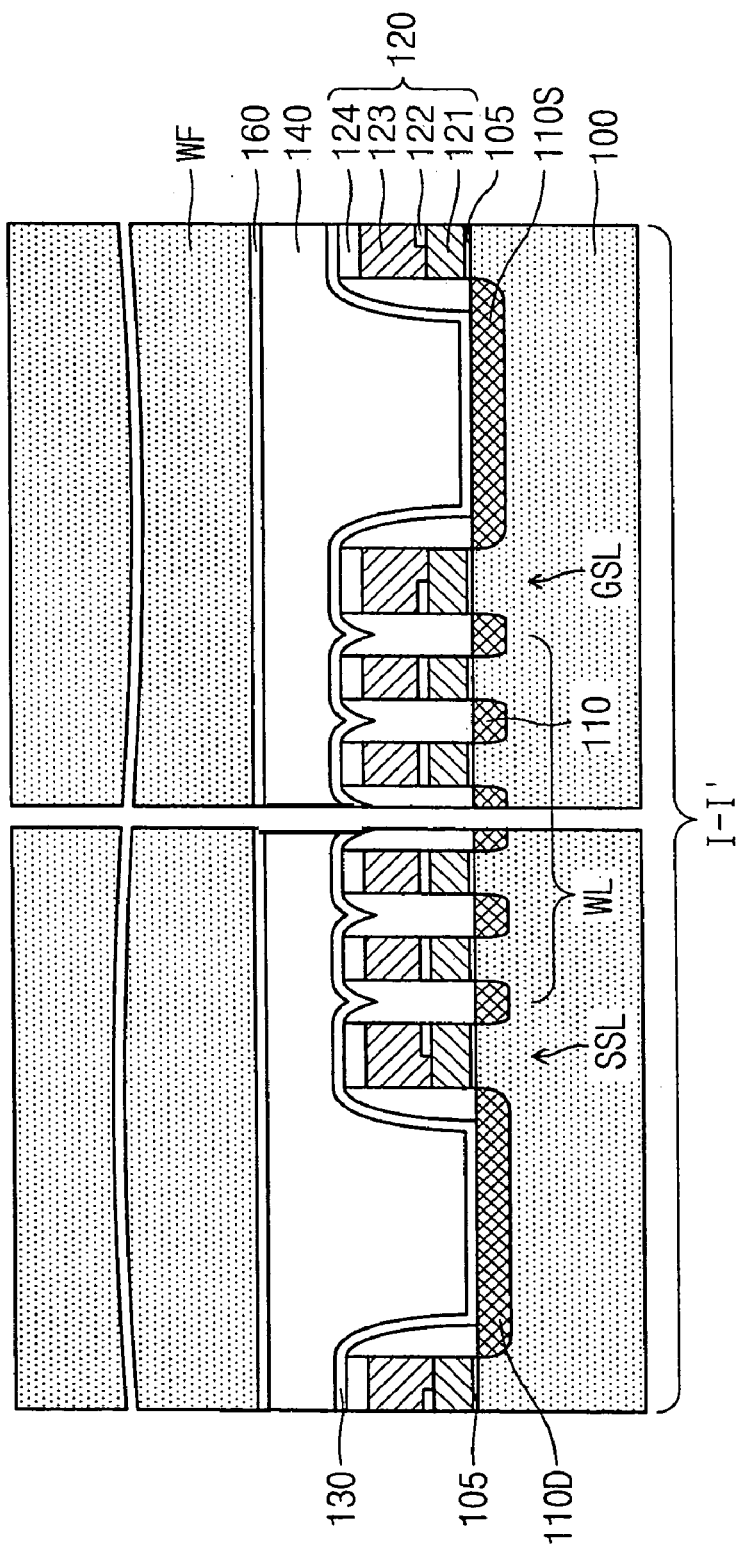
FIGS. 6A through 6C are sectional views illustrating a method of fabricating a NAND flash memory device according to another alternative exemplary disclosed embodiment.
Figure 6B:
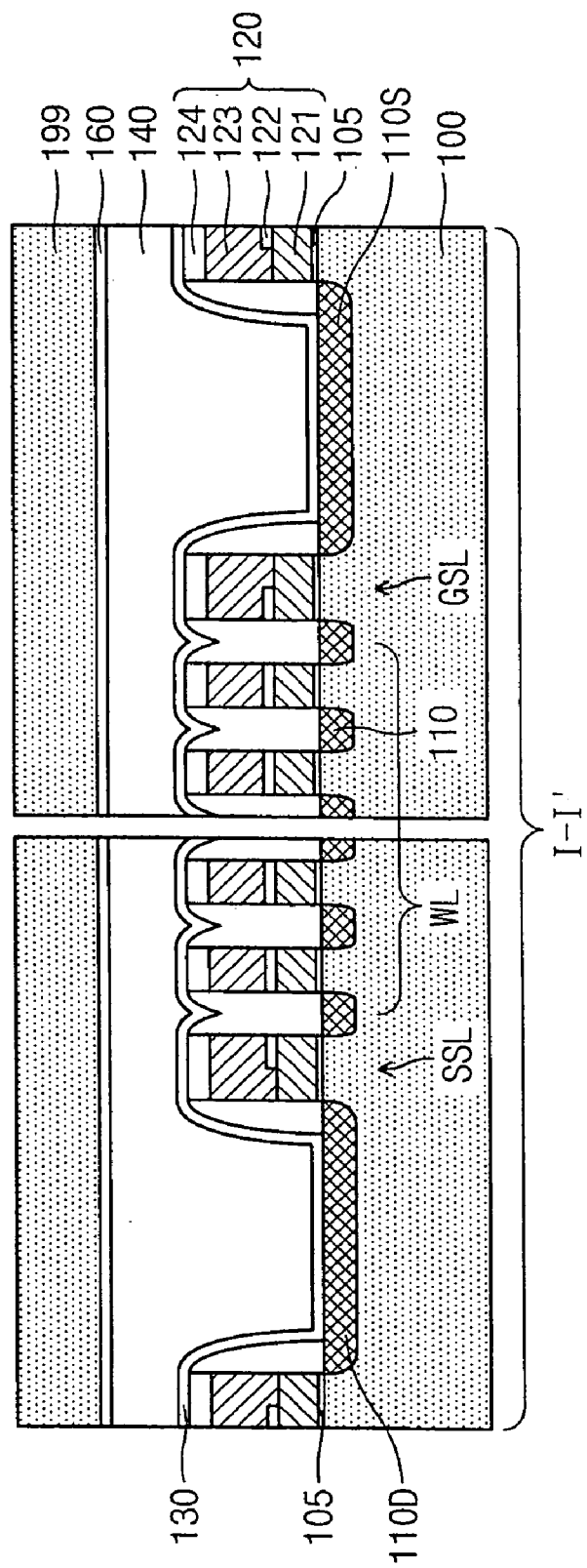
Figure 6C:
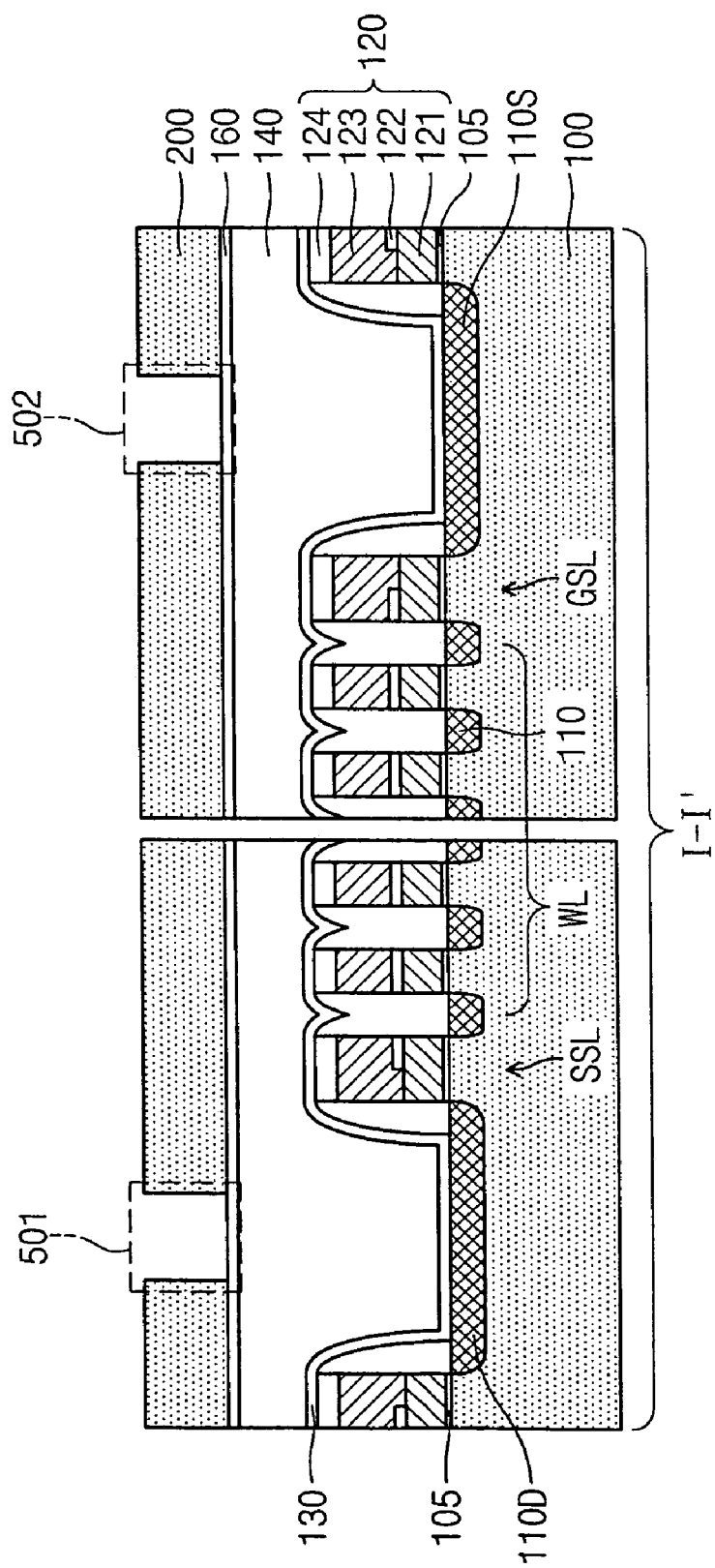

In an exemplary embodiment, the upper semiconductor layer 200 may be formed using an epitaxial technology in which the lower semiconductor layer 100 is used as a seed layer. More specifically, after forming the lower interlayer insulating layer 140, a seed hole 88 may be formed in the lower interlayer insulating layer 140 to expose a predetermined region of the lower semiconductor layer 100, as illustrated in FIGS. 1A, 1C, 5A and 5B. Herein, FIGS. 5A and 5B illustrate sectional views taken along the dotted line I-I' and II-II' of FIGS. 1A and 1C, respectively. Subsequently, a seed plug 99 filling the seed hole 88, and an epitaxial semiconductor layer 199 covering the lower interlayer insulating layer 140 are formed using one of many epitaxial technologies. Furthermore, the epitaxial semiconductor layer 199 extends from the seed plug 99. As a result of the epitaxial process, the epitaxial semiconductor layer 199 may have a single crystal structure. Thereafter, referring to FIG. 5B, the epitaxial semiconductor layer 199 is patterned to form the upper semiconductor layer 200 having the drain throughhole 501 and the source throughhole 502. In an exemplary embodiment, before patterning the epitaxial semiconductor layer 199, a process of planarizing a top surface of the epitaxial layer 199 may be additionally performed using planarization techniques such as, for example, a chemical mechanical polishing (CMP) technique, or the like.

Figure 1D:
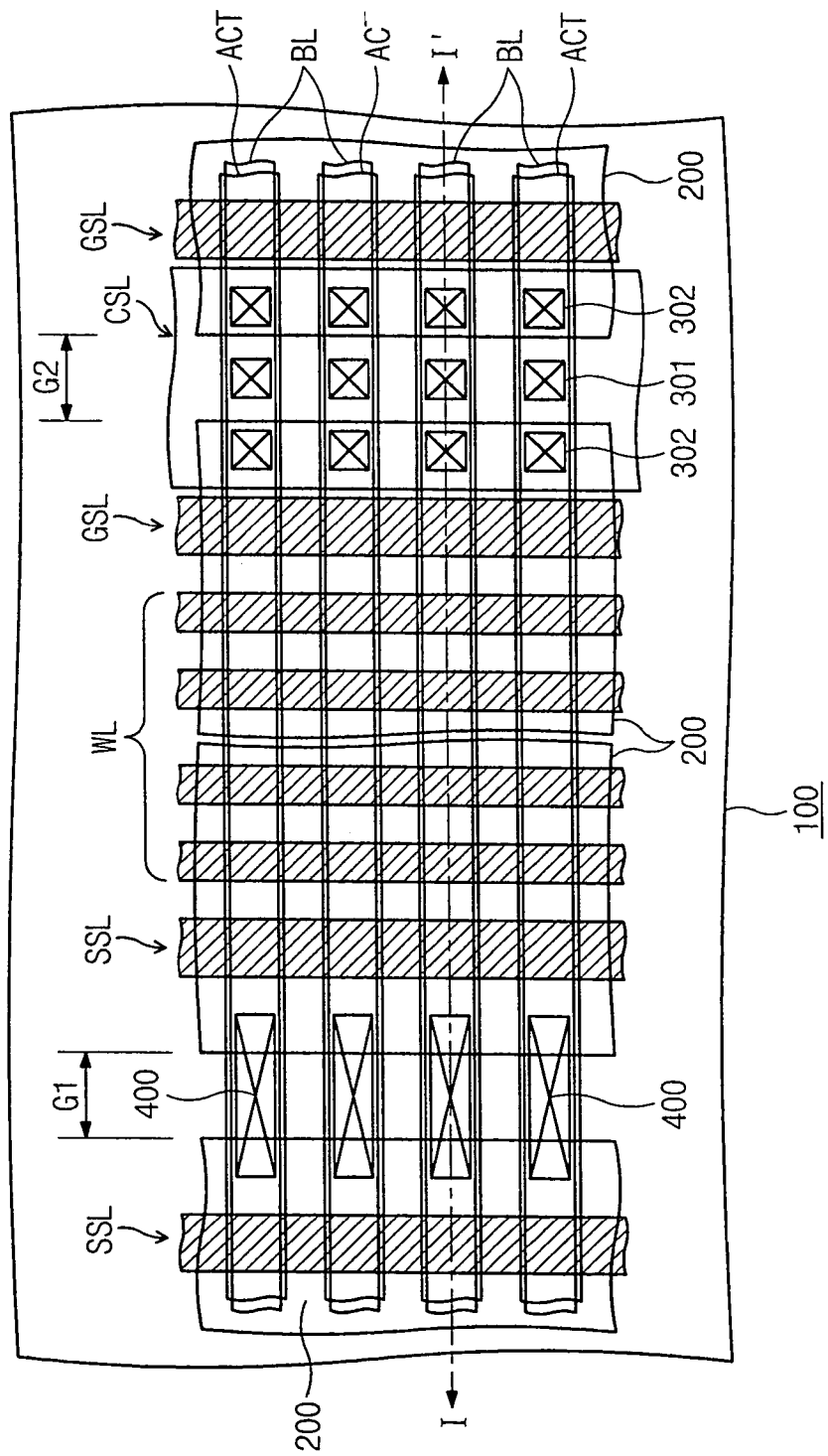

In an alternative exemplary embodiment, the upper semiconductor layer 200 may be formed using wafer-bonding technology. In particular, referring to FIG. 6A, after forming the interlayer insulating layer 140, a wafer WF formed of a single crystal semiconductor may be bonded to the lower interlayer insulating layer 140. More specifically, an adhesive layer may be additionally formed between the wafer WF and the lower interlayer insulating layer 140 to bond the wafer WF to the lower interlayer insulating layer 140. Furthermore, referring to FIGS. 6B and 6C, the wafer WF is etched to form a thin semiconductor layer 199', and thereafter the thin semiconductor layer 199' is patterned to form the upper semiconductor layer 200 having the drain throughhole 501 and the source throughhole 502. As shown in FIGS. 1B and 1D, an additional region for forming the seed hole 88, which is required in the above-described epitaxial technology, is not needed in the disclosed embodiment.

Figure 7A:
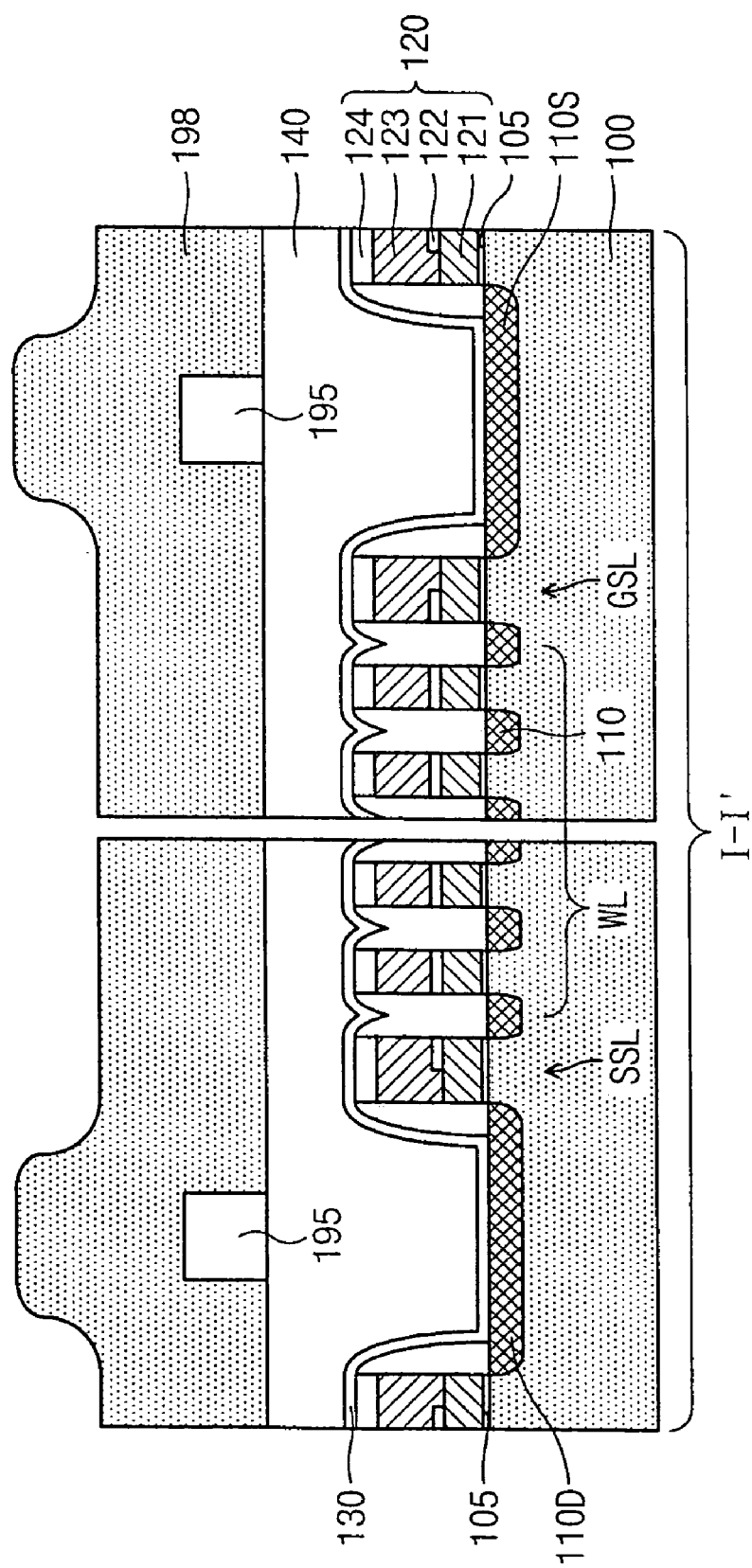
FIGS. 7A and 7B are sectional views illustrating a method of fabricating a NAND flash memory device according to yet another alternative exemplary disclosed embodiment.
Figure 7B:
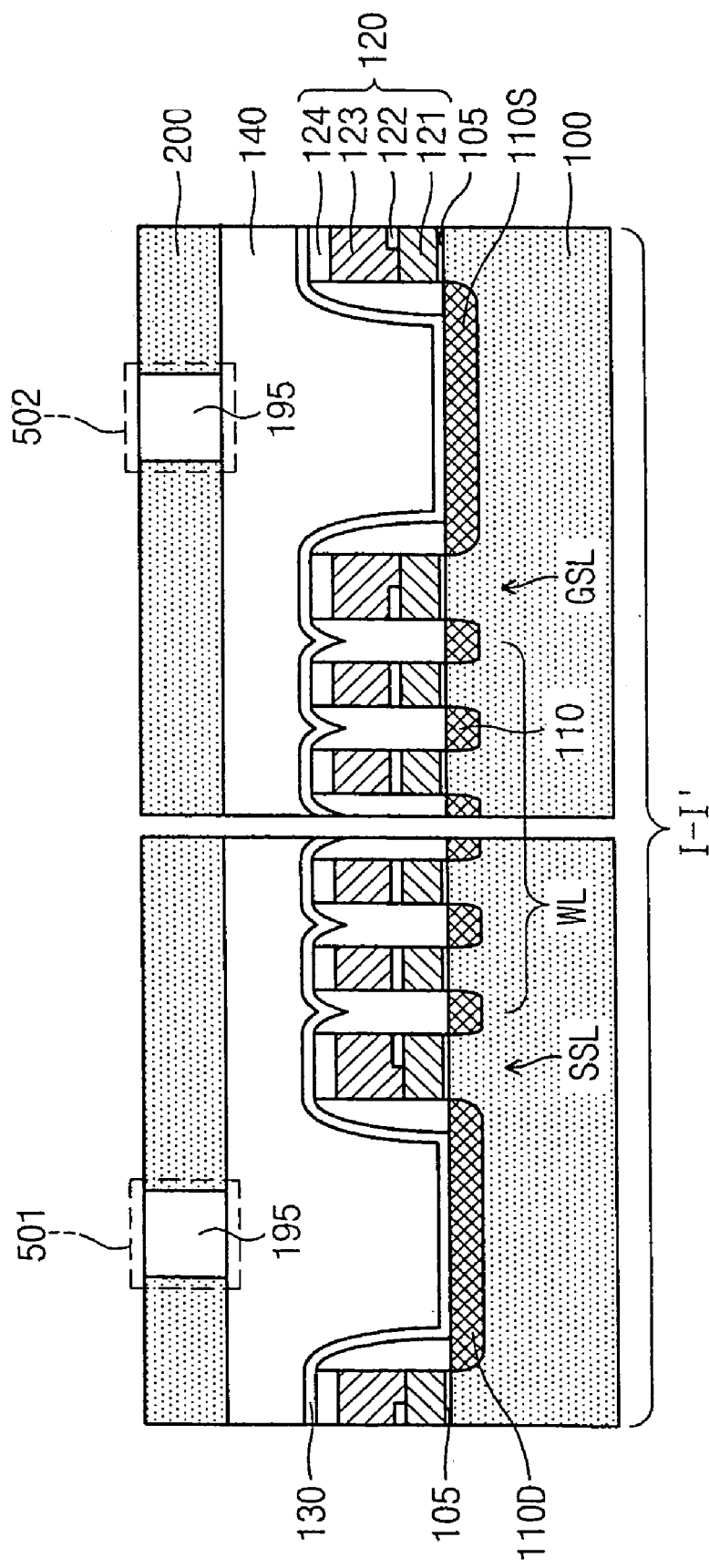

In an alternative exemplary embodiment, the upper semiconductor layer 200 may be formed using a deposition and crystallization processes. More specifically, as illustrated in FIG. 7A, mold patterns 195 are formed to define positions for the drain throughhole 501 and the source throughhole 502. Subsequently, a semiconductor layer 198 is deposited on the resultant structure that includes the mold patterns 195. In particular, the semiconductor layer 198 may be formed using a chemical vapor deposition (CVD) or an atomic layer deposition (ALD) process. In an exemplary embodiment, the semiconductor layer 198 may be one of amorphous, polycrystal, and single crystal silicons. Furthermore, a predetermined crystallization process may be additionally performed such that the semiconductor layer 198 has a single crystal structure. Thereafter, referring to FIG. 7B, a planarization etch is performed on the semiconductor layer 198 until the top surfaces of the mold patterns 195 are exposed. This, the upper semiconductor layer 200 is formed in a space defined by the mold patterns 195. In this case, because the upper semiconductor layer 200 is formed using the mold patterns 195 as a mold, the drain throughhole 501 and the source throughhole 502 penetrating the upper semiconductor layer 200 can be formed without an additional patterning process.

Referring back to FIG. 3A, an upper gate structure 220 is formed on the upper semiconductor layer 200. Thereafter, an ion implantation process is performed using the upper gate structure 220 as an ion mask to form upper impurity regions 210, upper source regions 210S, and upper drain regions 210D in the upper semiconductor layer 200. Subsequently, an upper etch stop layer 230 and a first upper interlayer insulating layer 241 are sequentially formed on the resultant structure including the upper gate structure 220.

Furthermore, the first upper interlayer insulating layer 241 and the lower interlayer insulating layer 140 are patterned to form source contact holes 150. These source contact holes 150 penetrate the source throughhole 502 and expose the lower source regions 110S. Furthermore, the source contact holes 150 are formed over the upper semiconductor layer 200 such that they have greater width than the source throughhole 502, and thus the top surfaces of the upper source regions are exposed. In addition, the upper etch stop layer 230 is formed for preventing the etch damage of the upper semiconductor layer 200 (e.g., more particularly, the upper source regions 210S) during the formation of the source contact holes 150. That is, the forming of the source contact holes 150 includes etching the first upper interlayer insulating layer 241 and the lower interlayer insulating layer 140 using an etch recipe that has an etch selectivity with respect to the upper etch stop layer 230. In addition, the upper etch stop layer 230 is beneficially formed thicker than the lower etch stop layer 130 for preventing the top surface of the upper semiconductor layer 200 from being damaged during the etching of the lower etch stop layer 130.

Figure 3B:
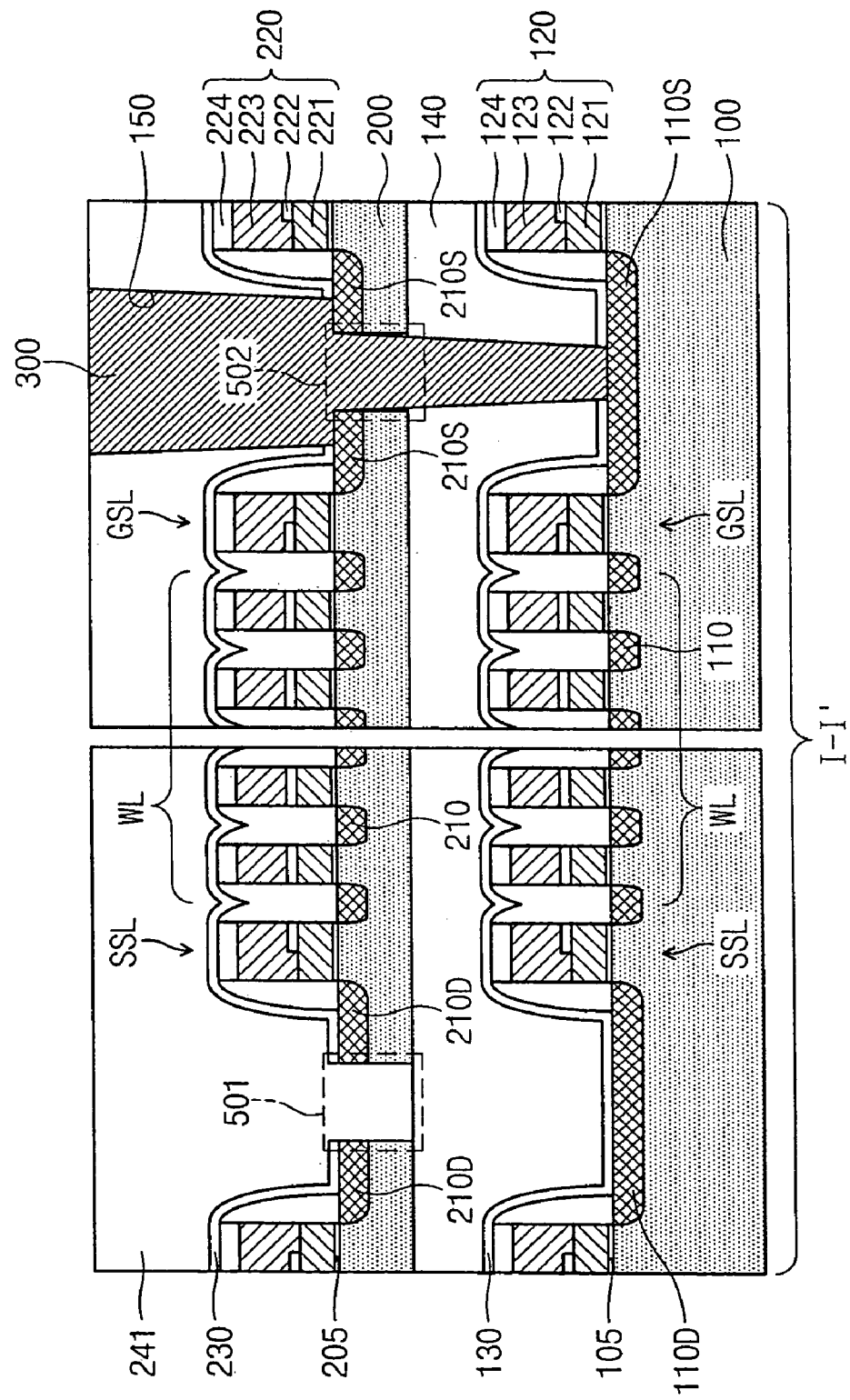
Figure 4A:
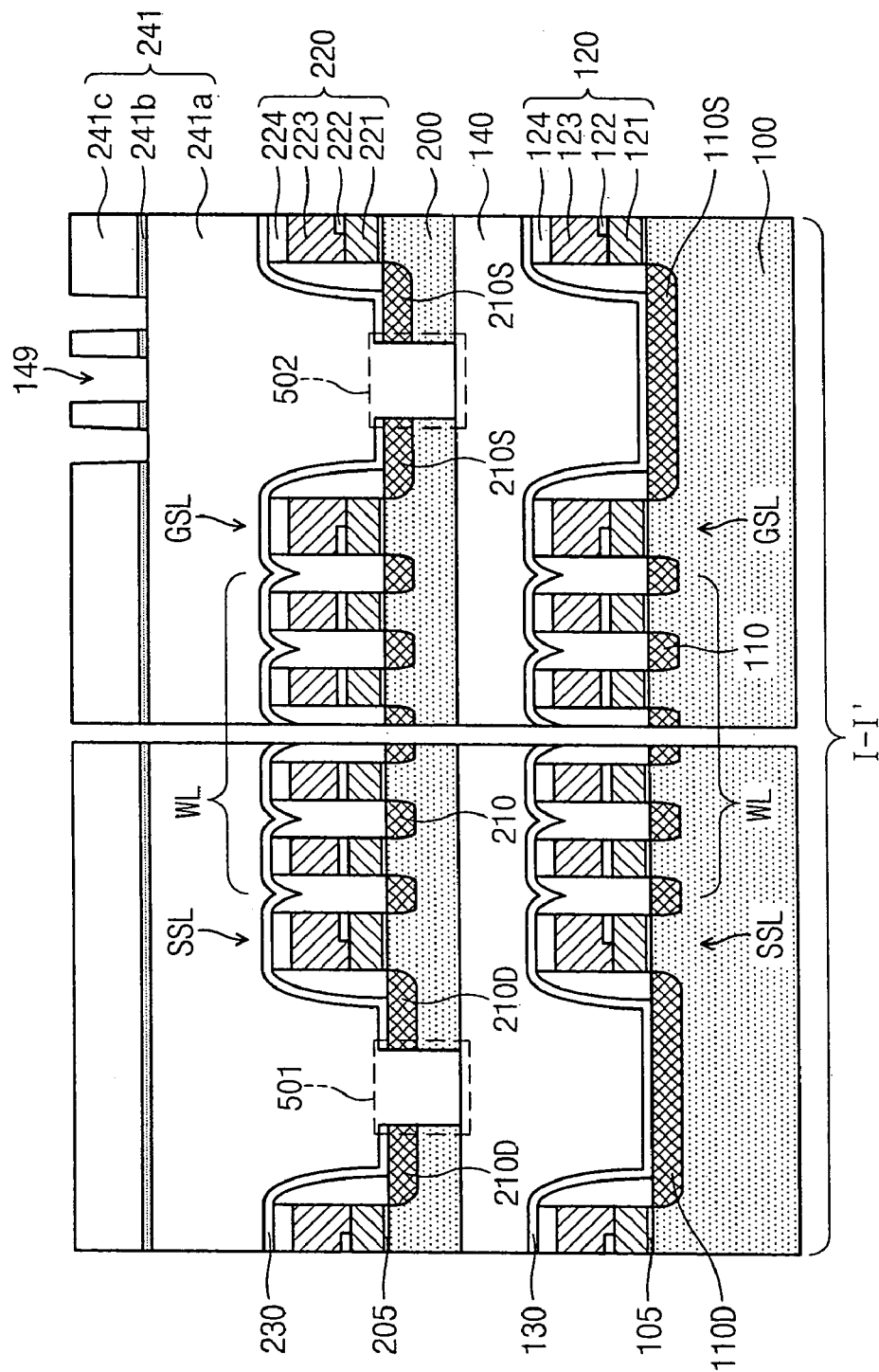
FIGS. 4A through 4C are sectional views illustrating a method of fabricating a NAND flash memory device according to an alternative exemplary disclosed embodiment.
Figure 4B:
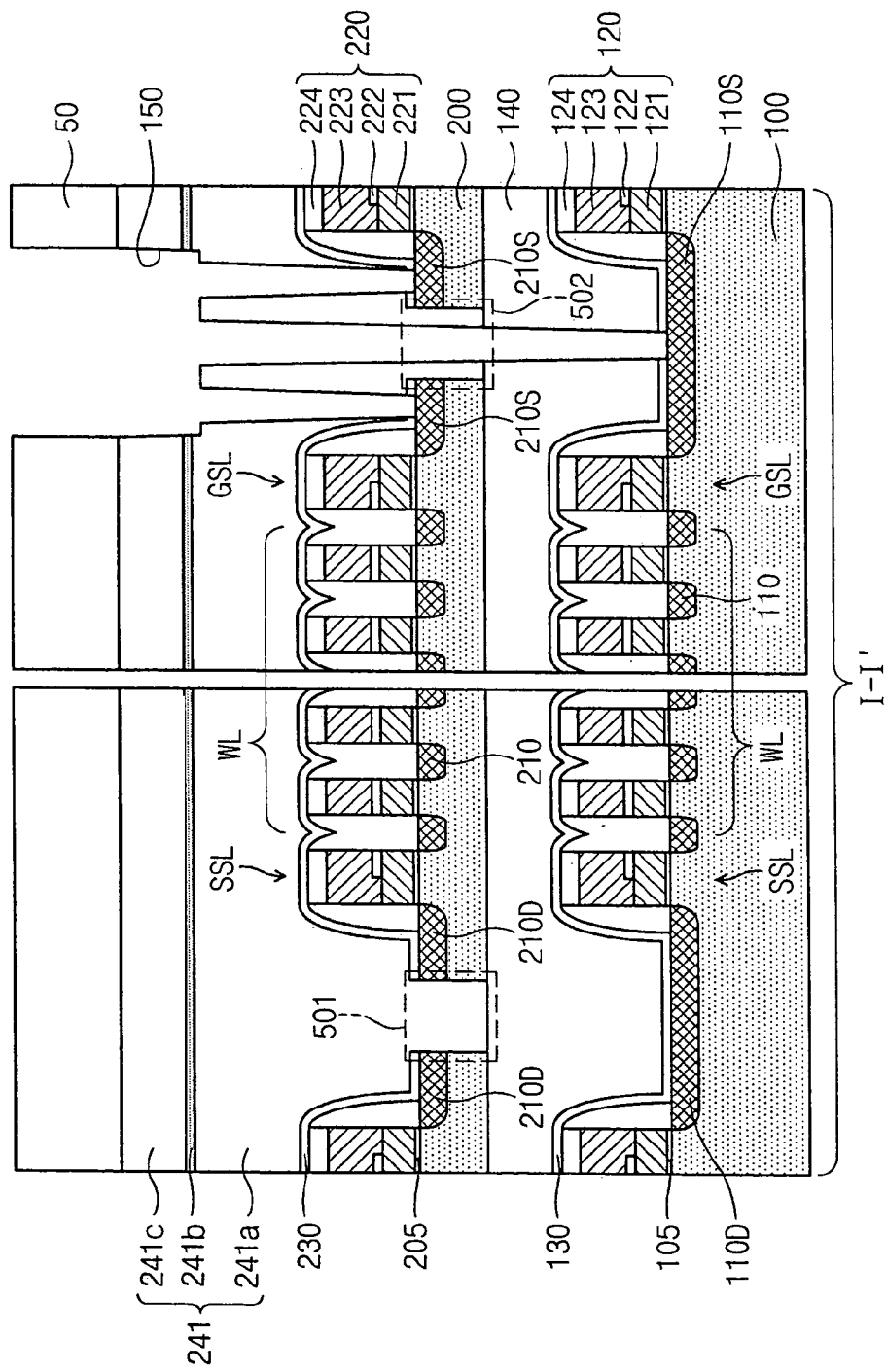
Figure 4C:
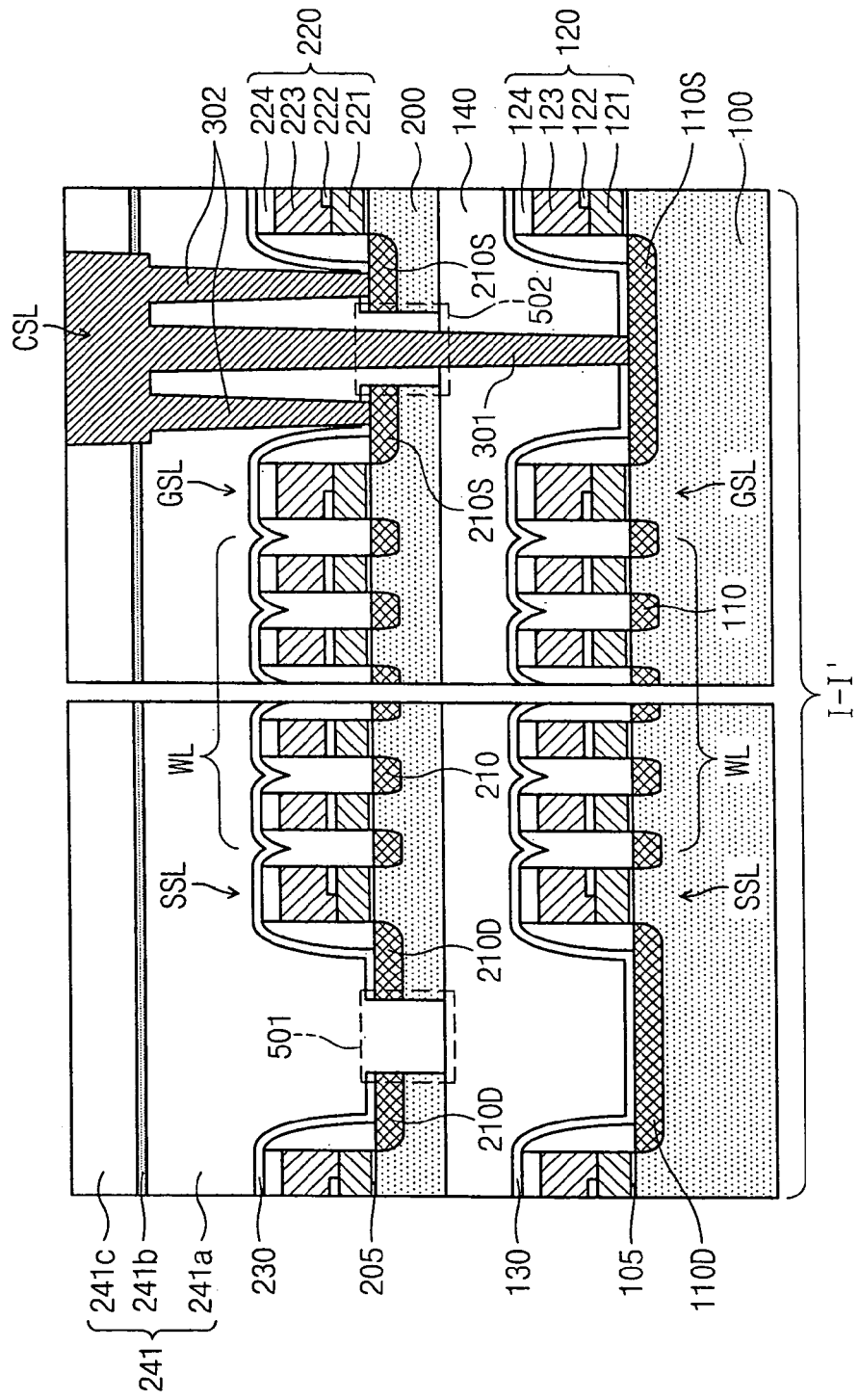

Referring to FIG. 3B, in an exemplary embodiment, source plugs 300 filling the source contact hole 150 and a common source line CSL are formed. Therefore, the source contact hole and the source plug 300 are formed using a damascene process. Alternatively, according to another exemplary embodiment, the source plug 300 may be formed using a dual damascene process, as illustrated in FIGS. 4A through 4C. Referring to FIGS. 4A through 4C, the first upper interlayer insulating layer 241 may include first to third insulating layers 241A, 241B, and 241C, which are stacked in sequence. The first upper interlayer insulating layer 241 is patterned to form a preliminary contact hole 149 for defining the source contact holes 150. In addition, a predetermined mask pattern 50 is then formed on the resultant structure to expose the preliminary contact holes 149. Furthermore, the first upper interlayer insulating layer 241 and the lower interlayer insulating layer 140 are patterned using the mask pattern 50 as an etch mask. Moreover, the second insulating layer 241b is used as an etch stop layer during a dual damascene process, and it is used for transferring the contact hole structure defined by the preliminary contact holes 149 to underlying layers 140 and 240. To this end, the second insulating layer 241b may be formed of a material having an etch selectivity with respect to the first and third insulating layers 241a and 241c. For example, the second insulating layer 241b may be formed of silicon nitride.

Figure 3C:
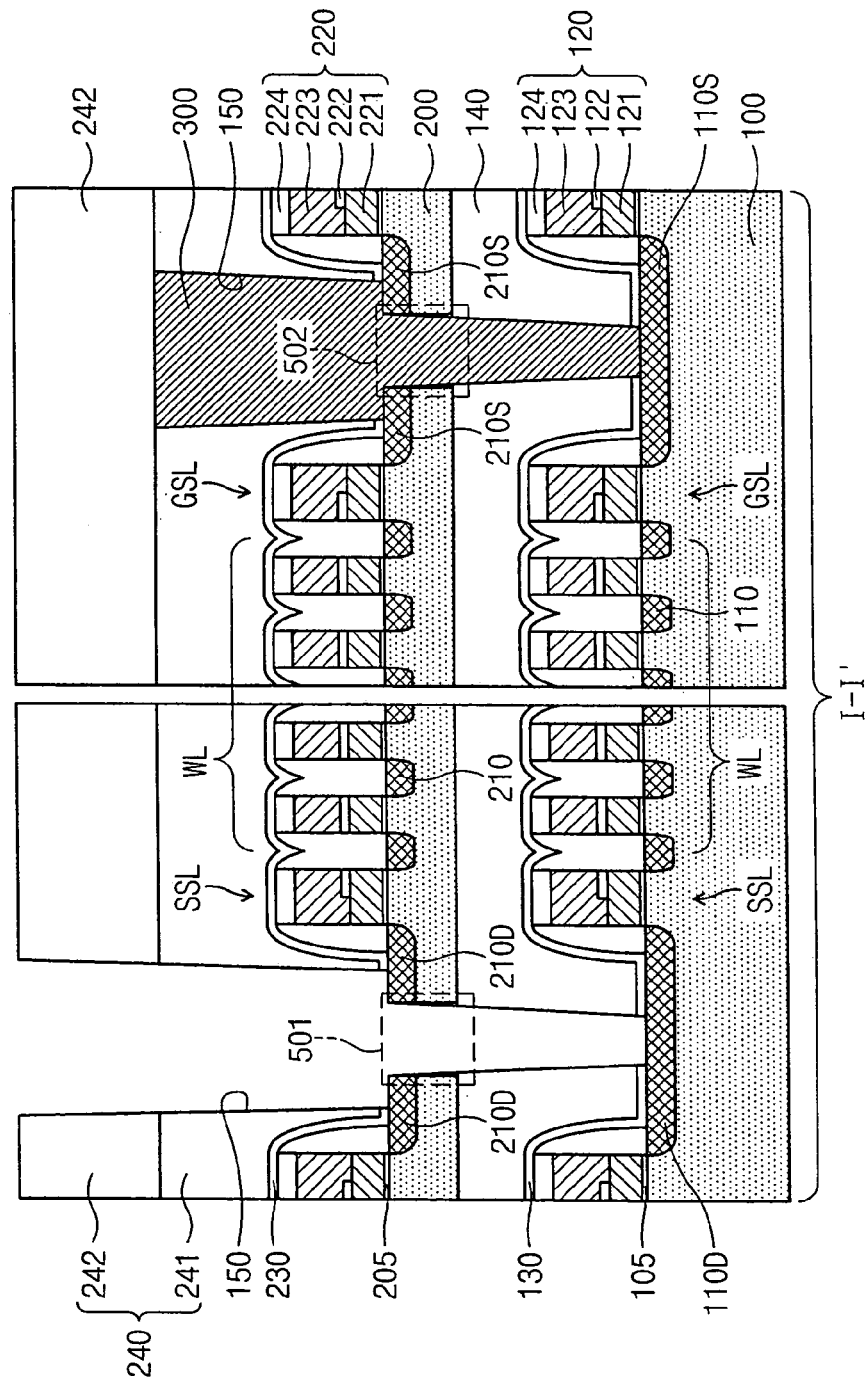

Referring to FIG. 3C, a second upper interlayer insulating layer 242 is formed on the resultant structure including the source plugs 300. Specifically, the second upper interlayer insulating layer 242 constitutes the upper interlayer insulating layer 240 together with the first upper interlayer insulating layer 241. Subsequently, the upper and lower interlayer insulating layers 240 and 140 are patterned to form drain contact holes 151 penetrating the drain throughhole 501 and exposing the lower drain regions 110D. In this case, the drain contact hole 151 is formed over the upper semiconductor layer 200 such that its width is greater than the drain throughhole 501 so that the top surfaces of the upper drain regions 210D are exposed. Furthermore, the upper etch stop layer 230 is formed for preventing the etch damage of the upper semiconductor layer 200 (e.g., more particularly, the upper drain regions 210D) while forming the drain contact holes 151. That is, the forming of the drain contact holes 151 includes etching the upper interlayer insulating layer 240 and the lower interlayer insulating layer 140 using an etch recipe having an etch selectivity with respect to the upper etch stop layer 230. In addition, it is beneficial that the upper etch stop layer 230 is formed thicker than the lower etch stop layer 130 for preventing the top surface of the upper semiconductor layer 200 from being damaged during the etching of the lower etch stop layer 130.

Figure 3D:
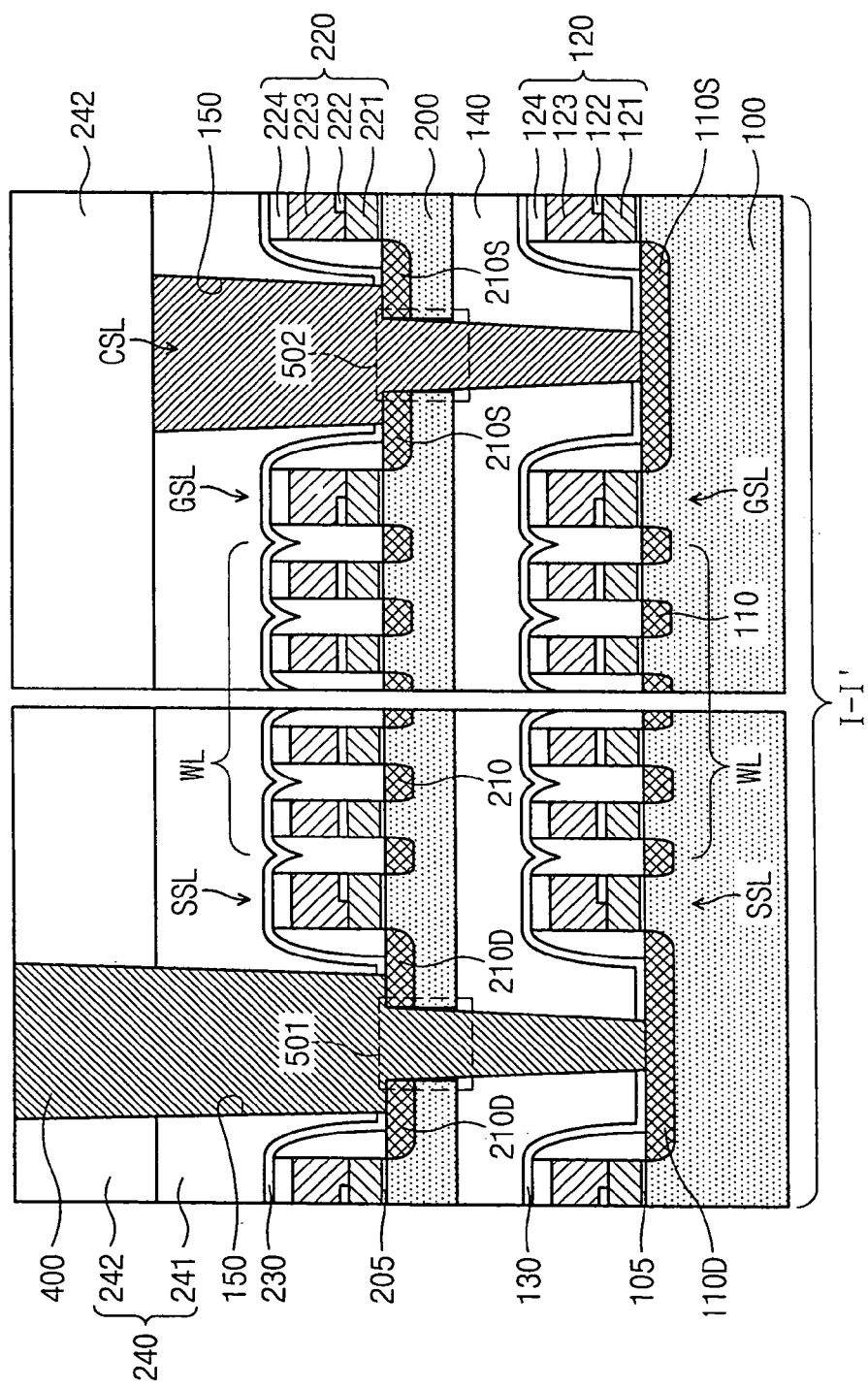

Referring to FIG. 3D, bit line plugs 400 are formed to fill the drain contact holes 151. Subsequently, bit lines BL, which are in contact with the bit line plugs 400 and cross over the word lines WL, are formed on the upper interlayer insulating layer 240. In an exemplary embodiment, a drain insulating layer (see reference numeral 155 of FIG. 2B) may be formed on the sidewalls of the drain contact hole 151. Similarly, before forming the source plugs 300, a source insulating layer (see 156 of FIG. 2B) may be formed on sidewalls of the source contact hole 150. The source and drain insulating layers 155 and 156 may be formed using a typical process of forming a spacer.

The above-disclosed methods may be used to fabricate any semiconductor device. In an exemplary embodiment, the upper semiconductor layer is formed such that it has throughholes over the lower source and drain regions of the lower semiconductor layer, wherein the throughholes penetrate the upper semiconductor layer. Furthermore, the source and bit line plugs are formed such that they pass through the throughholes. Accordingly, it may be possible to electrically connect the source and drain electrodes of three dimensionally arranged memory cells without a loss of chip area availability.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A NAND flash memory device comprising:
    a lower semiconductor layer and an upper semiconductor layer located over the lower semiconductor layer;
    a first drain region and a first source region located in the lower semiconductor layer;
    a second drain region and a second source region located in the upper semiconductor layer;
    a first gate structure located on the lower semiconductor layer;
    a second gate structure located on the upper semiconductor layer;
    a bit line located over the upper semiconductor layer; and
    at least one bit line plug connected between the bit line and the first drain region, wherein the at least one bit line plug extends through a drain throughhole located in the upper semiconductor layer, and
    wherein each gate structure comprises a string selection line located adjacent the first or second drain region, a ground selection line located adjacent the first or second source region, and a plurality of word lines disposed between the string selection line and the ground selection line, and wherein the bit line extends in a direction that crosses over the word lines.

2. The NAND flash memory device of claim 1, wherein the second drain region in the upper semiconductor layer is located adjacent to the drain throughhole.

3. The NAND flash memory device of claim 2, wherein the at least one bit line plug comprises:
    an upper bit line plug located over the upper semiconductor layer, and connected to the second drain region of the upper semiconductor layer adjacent the drain throughhole, wherein a width of the upper bit line plug is greater than a width of the drain throughhole; and
    a lower bit line plug which extends from the upper bit line plug and passes through the drain throughhole, and is connected to the first drain region of the lower semiconductor layer.

4. The NAND flash memory device of claim 1, wherein the at least one bit line plug is formed of at least one selected from the group consisting of tungsten, titanium, tantalum, titanium nitride, tantalum nitride, tungsten nitride, and polysilicon.

5. The NAND flash memory device of claim 1, further comprising a drain insulating layer which is located on inner walls of the drain throughhole and which isolates the at least one bit line plug from a sidewall of the upper semiconductor layer.

6. The NAND flash memory device of claim 1, further comprising:
    a common source line located under the bit line and extending parallel with the ground selection lines of the first and second gate structures; and at least one source plug electrically connected to the common source line and the first and second source regions of the respective lower and upper semiconductor layers.

7. The NAND flash memory device of claim 6, wherein the upper semiconductor layer further includes a source throughhole located over the first source regions of the lower semiconductor layer, and wherein the at least one source plug passes through the source throughhole.

8. The NAND flash memory device of claim 7, wherein the second source region of the upper semiconductor layer is adjacent to the source throughhole.

9. The NAND flash memory device of claim 8, wherein the at least one source plug comprises:
   an upper source plug located over the upper semiconductor layer, and connected to the second source region of the upper semiconductor layer adjacent the source throughhole, wherein a width of the upper source plug is greater than a width of the source throughhole; and
   a lower source plug which extends from the upper source plug and passes through the source throughhole, and is connected to the first source region of the lower semiconductor layer.

10. The NAND flash memory device of claim 7, wherein the source plug comprises:
    an upper source plug extending between the common source line and the second source region of the upper semiconductor layer; and
    a lower source plug extending between the common source line and first source region of the lower semiconductor layer,
    wherein the lower source plug passes through the source throughhole and is spaced from the upper source plug.

11. The NAND flash memory device of claim 6, wherein the at least one source plug is formed of at least one selected from the group consisting of tungsten, titanium, tantalum, titanium nitride, tantalum nitride, tungsten nitride, and polysilicon.

12. The NAND flash memory device of claim 6, further comprising a source insulating layer which is located on inner wells of the source throughhole and which isolates the at least one source plug from a sidewall of the upper semiconductor layer.

13. A NAND flash memory device comprising:
    a lower semiconductor layer and an upper semiconductor layer located over the lower semiconductor layer;
    a first drain region and a first source region located in the lower semiconductor layer;
    a second drain region and a second source region located in the upper semiconductor layer;
    a first gate structure located on the lower semiconductor layer;
    a second gate structure located on the upper semiconductor layer;
    a bit line located over the upper semiconductor layer; and at least one bit line plug connected between the bit line and the first drain region,
    wherein the at least one bit line plug extends through a drain throughhole located in the upper semiconductor layer, and
    wherein the at least one bit line plug comprises:
       an upper bit line plug extending between the bit line and the second drain region of the upper semiconductor layer; and
       a lower bit line plug extending between the bit line and first drain region of the lower semiconductor layer,
       wherein the lower bit line plug passes through the drain throughhole and is spaced from the upper bit line plug.

14. The NAND flash memory device of claim 13, further comprising a drain insulating layer which is located on inner walls of the drain throughhole and which isolates the at least one bit line plug from a sidewall of the upper semiconductor layer.

15. The NAND flash memory device of claim 13, wherein the second drain region in the upper semiconductor layer is located adjacent to the drain throughhole, and
    wherein the at least one bit line plug comprises:
    an upper bit line plug located over the upper semiconductor layer, and connected to the second drain region of the upper semiconductor layer adjacent the drain throughhole, wherein a width of the upper bit line plug is greater than a width of the drain throughhole; and
    a lower bit line plug which extends from the upper bit line plug and passes through the drain throughhole, and is connected to the first drain region of the lower semiconductor layer.

16. A NAND flash memory device comprising:
    a lower semiconductor layer and an upper semiconductor layer located over the lower semiconductor layer;
    a first drain region and a first source region located in the lower semiconductor layer;
    a second drain region and a second source region located in the upper semiconductor layer;
    a first gate structure located on the lower semiconductor layer;
    a second gate structure located on the upper semiconductor layer;
    a bit line located over the upper semiconductor layer; at least one bit line plug connected between the bit line and the first drain region,
    wherein the at least one bit line plug extends through a drain throughhole located in the upper semiconductor layer;
    an upper etch stop layer which is located over the upper semiconductor layer and which covers the second gate structure; and
    a lower etch stop layer which is located over the lower semiconductor layer and which covers the first gate structure, wherein the upper etch stop layer is thicker than the lower etch stop layer.

17. The NAND flash memory device of claim 16, further comprising a drain insulating layer which is located on inner walls of the drain throughhole and which isolates the at least one bit line plug from a sidewall of the upper semiconductor layer.

18. The NAND flash memory device of claim 16, wherein the second drain region in the upper semiconductor layer is located adjacent to the drain throughhole, and
    wherein the at least one bit line plug comprises:
    an upper bit line plug located over the upper semiconductor layer, and connected to the second drain region of the upper semiconductor layer adjacent the drain throughhole, wherein a width of the upper bit line plug is greater than a width of the drain throughhole; and
    a lower bit line plug which extends from the upper bit line plug and passes through the drain throughhole, and is connected to the first drain region of the lower semiconductor layer.

* * * * *